US011494265B2

(12) United States Patent
Saxena

(10) Patent No.: US 11,494,265 B2
(45) Date of Patent: *Nov. 8, 2022

(54) SECURING AGAINST ERRORS IN AN ERROR CORRECTING CODE (ECC) IMPLEMENTED IN AN AUTOMOTIVE SYSTEM

(71) Applicant: NVIDIA Corporation, Santa Clara, CA (US)

(72) Inventor: Nirmal R. Saxena, Los Altos Hills, CA (US)

(73) Assignee: NVIDIA Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/139,413

(22) Filed: Dec. 31, 2020

(65) Prior Publication Data

US 2021/0124644 A1 Apr. 29, 2021

Related U.S. Application Data

(63) Continuation of application No. 16/137,002, filed on Sep. 20, 2018, now Pat. No. 10,908,995.

(Continued)

(51) Int. Cl.
*G06F 11/10* (2006.01)
*H03M 13/29* (2006.01)
*H03M 13/19* (2006.01)

(52) U.S. Cl.
CPC ...... *G06F 11/1076* (2013.01); *G06F 11/1048* (2013.01); *H03M 13/19* (2013.01); *H03M 13/2906* (2013.01)

(58) Field of Classification Search
CPC .......... G06F 11/1076; G06F 11/1048; H03M 13/19; H03M 13/2906
See application file for complete search history.

(56) References Cited

U.S. PATENT DOCUMENTS 6,496,940 B1 12/2002 Horst et al.
6,910,169 B2 6/2005 Sharma
(Continued)

FOREIGN PATENT DOCUMENTS

CN 101211667 A 7/2008
CN 102567134 A 7/2012
(Continued)

OTHER PUBLICATIONS

Naeimi et al., "Fault Secure Encoder and Decoder for Memory Applciations," IEEE International Symposium on Defect and Fault Tolerance in VLSI Systems, Sep. 26-28, 2007, 9 pp.
(Continued)

*Primary Examiner* — Kyle Vallecillo
(74) *Attorney, Agent, or Firm* — Leydig, Voit & Mayer, Ltd.

(57) ABSTRACT

In general, data is susceptible to errors caused by faults in hardware (i.e. permanent faults), such as faults in the functioning of memory and/or communication channels. To detect errors in data caused by hardware faults, the error correcting code (ECC) was introduced, which essentially provides a sort of redundancy to the data that can be used to validate that the data is free from errors caused by hardware faults. In some cases, the ECC can also be used to correct errors in the data caused by hardware faults. However, the ECC itself is also susceptible to errors, including specifically errors caused by faults in the ECC logic. A method, computer readable medium, and system are thus provided for securing against errors in an ECC.

21 Claims, 16 Drawing Sheets

Related U.S. Application Data

(60) Provisional application No. 62/566,067, filed on Sep. 29, 2017.

(56) References Cited

U.S. PATENT DOCUMENTS

| | | | |
|---|---|---|---|
| 7,353,438 | B2 | 4/2008 | Leung et al. |
| 8,024,718 | B2 | 9/2011 | Miranda et al. |
| 8,516,336 | B2 | 8/2013 | Cremer et al. |
| 8,875,002 | B1 | 10/2014 | Dutta |
| 9,087,612 | B2 | 7/2015 | Franceschini et al. |
| 9,230,687 | B2 | 1/2016 | Cordero et al. |
| 9,337,869 | B2 | 5/2016 | Hung et al. |
| 9,384,091 | B2 | 7/2016 | Orion |
| 9,436,546 | B2 | 9/2016 | Marshall et al. |
| 9,748,977 | B2 | 8/2017 | Gendler et al. |
| 9,785,500 | B1 | 10/2017 | Ware et al. |
| 9,842,021 | B2 | 12/2017 | Halbert et al. |
| 10,388,392 | B2 | 8/2019 | Aberl et al. |
| 2004/0133836 | A1 | 7/2004 | Williams |
| 2005/0044467 | A1 | 2/2005 | Leung et al. |
| 2007/0002649 | A1* | 1/2007 | Dubey ............... G11C 29/024 365/201 |
| 2011/0307758 | A1* | 12/2011 | Fillingim ............ G06F 11/1048 714/758 |
| 2013/0179753 | A1 | 7/2013 | Flynn et al. |
| 2013/0205183 | A1* | 8/2013 | Fillingim ............. H03M 13/353 714/773 |
| 2014/0149827 | A1 | 5/2014 | Kim et al. |
| 2015/0113342 | A1 | 4/2015 | Jung et al. |
| 2016/0034348 | A1 | 2/2016 | Park et al. |
| 2017/0286197 | A1 | 10/2017 | Halbert et al. |
| 2017/0346504 | A1 | 11/2017 | Johar |
| 2018/0018216 | A1* | 1/2018 | Halford ................. H04L 1/004 |
| 2018/0293129 | A1 | 10/2018 | Alberl et al. |
| 2018/0336959 | A1 | 11/2018 | Minzoni |
| 2020/0177418 | A1* | 6/2020 | Hoydis ............. H04L 25/03834 |

FOREIGN PATENT DOCUMENTS

| | | |
|---|---|---|
| CN | 105308575 A | 2/2016 |
| TW | 200910087 A | 3/2009 |
| TW | 201329697 A | 7/2013 |
| TW | 201416849 A | 5/2014 |
| WO | WO 2017192626 A1 | 11/2017 |

OTHER PUBLICATIONS

Venkatarami Reddy et al., "Defect Secure Encoder and Decoder for Very Small Memory Appliance," International Journal of Advanced Research in Computerand Communication Engineering, vol. 2, Issue 5, May 2013, pp. 2265-2273.

Naseer et al., "Parallel Double Error Correcting Code Design to Mitigate Multi-Bit Upsets in SRAMs," ESSCIRC 2008—34$^{th}$ European Solid-State Circuits Conference, Sep. 15-19, 2008, pp. 222-225.

Lee et al., "Small-Area Parallel Syndrome Calculation for Strong Bch Decoding," 2012 IEEE International Conference on Acoustics, Speech and Signal Processing (ICASSP), Mar. 25-30, 2012, retrieved from http://www.mirlab.org/conference_papers/International_Conference/ICASSP%20212/pdfs/0001609.pdf, pp. 1609-1612.

Chen, "Hsiao-Code Check Matrices and Recursively Balanced Matrices," Preprint, ArXiv, Mar. 8, 2008, 8 pp.

Voskamp, et al., "Error Detection in Fault Secure Controllers Using State Encoding," 5 pp.

U.S. Appl. No. 16/137,002, filed Sep. 20, 2018.

* cited by examiner

| Data Bits | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
| 0 | 0 | 0 | 0 | 0 | 0 | 0 | 0×1 | 0×1 | 0×1 | 0 | 0 | 0 | 0 | 0 | 0 | 0 | 0 | 0 | 0 | 0 | 0 | 0×1 | 0×1 | 0×1 | 0 | 0 | 0 | 0 | 0 | 0 |

Fig. 2E

SECURING AGAINST ERRORS IN AN ERROR CORRECTING CODE (ECC) IMPLEMENTED IN AN AUTOMOTIVE SYSTEM

CLAIM OF PRIORITY

This application is a continuation of U.S. Non-Provisional application Ser. No. 16/137,002, filed Sep. 20, 2018, which claims the benefit of U.S. Provisional Application No. 62/566,067 titled "Fault-Secure Error Control Code Designs for Improving Resiliency of Electronic Systems including AI-based Systems," filed Sep. 29, 2017, the entire contents of which are incorporated herein by reference.

FIELD OF THE INVENTION

The present invention relates to codes used for controlling errors data, and more particularly to error correcting code (ECC) logic used for controlling errors data.

BACKGROUND

In general, data is susceptible to errors caused by faults in hardware (i.e. permanent faults), such as faults in the functioning of memory and/or communication channels. To detect errors in data caused by hardware faults, codes have been developed which provide a sort of redundancy to the data. In some cases, these codes can even be used to correct the error in the data.

One design of a code developed for detecting, and in some cases correcting, data errors caused by hardware faults is the error correcting code (ECC). In general, the ECC is logic that includes an encoder to encode a copy of the data to form a code, where the code is transmitted and/or stored in association with the data. The ECC logic further includes a decoder to decode the code, such that the code, once decoded, can then be used for detecting, and optionally correcting, errors in the data. Unfortunately, the ECC logic is also susceptible to faults which can introduce errors into the code itself. For example, faults in the encoder and/or decoder, such as single stuck-at faults where a gate of the encoder/decoder is stuck at a particular value, can introduce errors in the code. Errors in the code may cause false detection of errors in the data, and worse, false correction of the data which will further introduce errors into the data.

To date, the ECC design has not been adapted to secure against errors introduced by the ECC logic itself. There is thus a need for addressing these issues and/or other issues associated with the prior art.

SUMMARY

A method, computer readable medium, and system are disclosed for securing against errors in an ECC. In use, a code created for data using error correcting code (ECC) logic is accessed, where the code is stored in a first memory and the data is stored in a second memory. Additionally, an error in the code caused by an error in the ECC logic is detected. Further, it is determined whether the error in the code is correctable. Responsive to determining that the error in the code is correctable: the error in the code is corrected to form a corrected code, the data is retrieved from the second memory, and the retrieved data is verified using the corrected code. Responsive to determining that the error in the code is not correctable, the error in the code is indicated as not being correctable.

BRIEF DESCRIPTION OF THE DRAWINGS

FIGS. 2A-E illustrate a parity check matrix of a SEC-DED ECC logic design in association with an ECC logic algorithm design for securing against errors in the ECC, in accordance with an embodiment.

DETAILED DESCRIPTION

In general, data is susceptible to errors caused by faults (failures) in hardware, such as faults in the functioning of memory and/or communication channels. To detect errors in data (which could be the result of faulty hardware or radiation interacting with the stored data), error correcting code (ECC) was introduced. When data is being stored (or transmitted), an ECC is calculated that corresponds to the stored data; when the data is later retrieved, this calculation is performed again. If the ECC matches the results of the second calculation, then the data is free from errors; if the ECC doesn't match, then an error has been introduced. The ECC therefore represents a "correct" form of the data. In some cases, since the ECC represents a "correct" form of the data, the ECC can also be used to correct any errors in the data. However, the ECC itself is also susceptible to errors, including specifically errors caused by faults in the ECC logic (circuits), such as hardware faults in the encoder and/or decoder of the ECC logic. Errors in the ECC may cause false detection of errors in the data, and worse, false correction of the data which will further introduce errors into the data.

The description below provides various embodiments for securing against errors in the ECC specifically caused by faults in the ECC logic, and thus provide various fault-secure ECC logic designs. These fault-secure ECC logic designs can be used independently or in conjunction with one another, and include constraining a hardware configuration of specific portions of the ECC logic (e.g. the encoder and/or decoder), and also include modifying the traditional computer code (algorithm) utilized by the ECC logic. These fault-secure ECC logic designs ultimately secure against the aforementioned errors in the ECC by providing the ability to detect the errors and either 1) correct the ECC for use in validating the data or 2) identify the ECC as uncorrectable and thus unusable for validating the data. Moreover, the fault-secure ECC logic designs can be implemented in various systems to secure the data of those systems, such as automotive systems and/or artificial intelligence ("AI")-based systems.

Figure 1A:
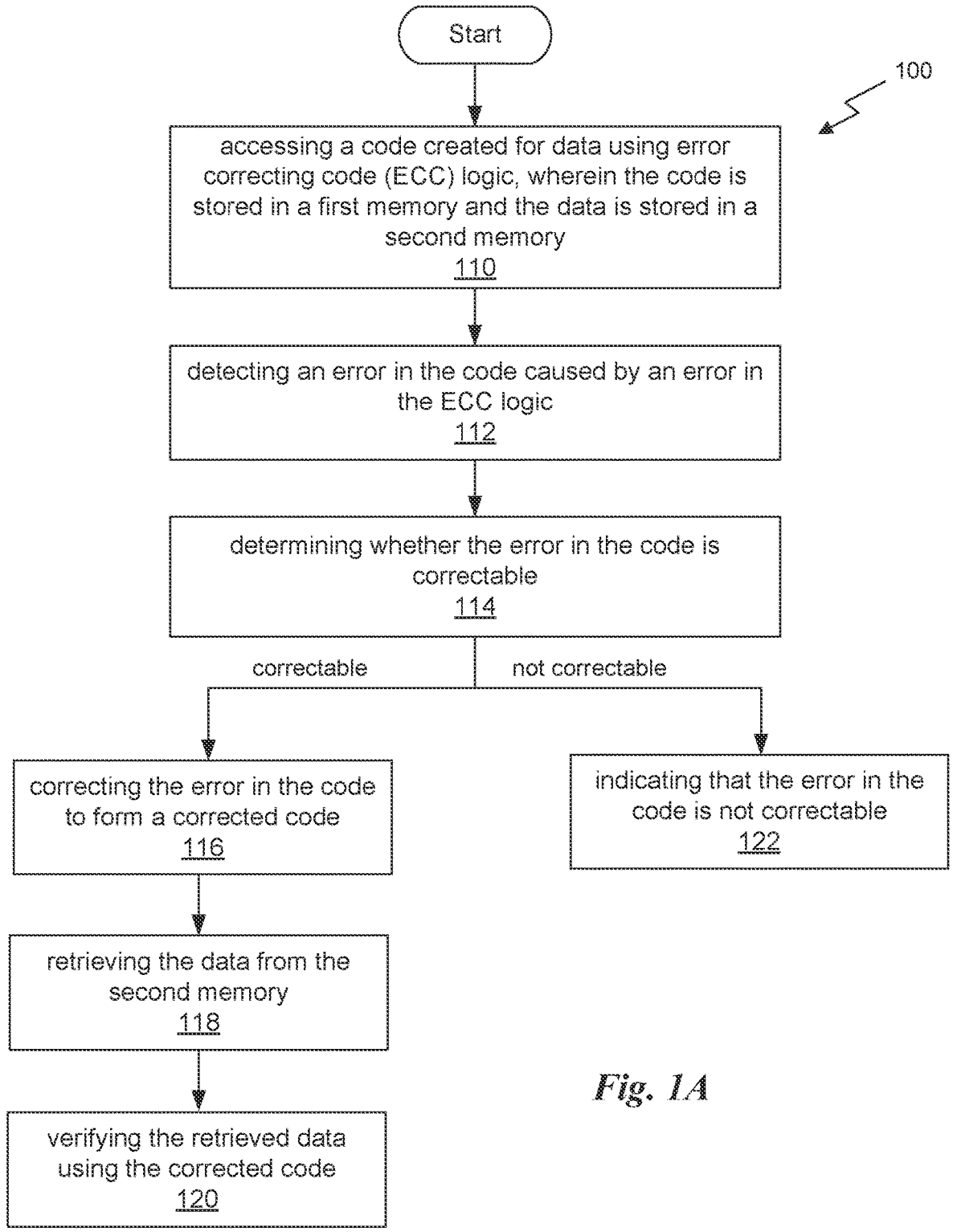
FIG. 1A illustrates a flowchart of a method for securing against errors in an ECC, in accordance with an embodiment.

FIG. 1A illustrates a flowchart of a method 100 for securing against errors in an ECC, in accordance with an embodiment. The method 100 may be performed by ECC logic (circuitry), in connection with a processor, such as a GPU (graphics processing unit), CPU (central processing unit), or any processor capable of securing against errors in an ECC. More specifically, the method 100 may be implemented, in some optional embodiments, using the parallel processing element (PPU) 300 of FIG. 3 and/or in the context of the any of the embodiments described below. Furthermore, persons of ordinary skill in the art will understand that any system that performs method 100 is within the scope and spirit of embodiments of the present invention.

As shown in operation 110, a code created for data using error correcting code (ECC) logic is accessed, where the code is stored in a first memory and the data is stored in a second memory. Since the code is created using the ECC logic, in the context of the present description the code may also be referred to as an ECC created for the data. The data may be any type of data for which validation using the code is desired, such as an instruction that is executable by a processor (including GPUs, CPUs, cores), an operand, an address, etc., and in this case the code may be created for providing a redundancy to the data. For example, the data may be capable of being subjected to error introduced through a permanent fault in hardware (e.g. memory, communication channel), and the code may be created for verifying whether the data includes the error. Thus, the code may be created before the data is processed by the hardware, and accordingly before the potential error is capable of being introduced into the data (e.g. before the data is stored in the memory and/or before the data is communicated over the communication channel). Further, the code may be accessed with reference to the present operation when retrieved from the first memory for use in validating the data.

Operation of the ECC logic to create the code is described in more detail below with reference to FIG. 1B. However, in general, the ECC logic is hardware that includes an encoder that encodes the data to create the code, and a decoder that decodes the code for use in validating the data. Both the encoder and the decoder are implemented in hardware of the ECC logic, and therefore are subject to faults. The ECC logic may be designed as single-error detecting (SED), single-error correcting (SEC), or single-error correcting-double error detecting (SEC-DED), and accordingly the code created by the ECC logic may be SED, SEC, or SEC-DED.

As noted above, the code is stored in the first memory and the data is stored in the second memory. In one embodiment, the first and second memories may be different physical memories. For example, in this embodiment, the first memory may be dedicated for use in storing codes created by the ECC logic and the second memory may be dedicated for use in storing data from which the codes are generated. In another embodiment, the first and second memories may be different portions of a same physical memory. For example, the first memory may be a first portion of the physical memory dedicated for use in storing codes created by the ECC logic and the second memory may be a second portion of the physical memory dedicated for use in storing data from which the codes are generated.

Additionally, as shown in operation 112, an error in the code caused by an error in the ECC logic is detected. In the context of the present description, the error in the ECC logic includes a hardware fault in the ECC logic, such as a single stuck-at fault where a gate in the ECC logic is stuck at a particular value (i.e. logical 0, 1, etc.). In one embodiment, the error in the code may be caused by an error in an encoder of the ECC logic that encoded the data to form the code. In another embodiment, the error in the code may be caused by an error in a decoder of the ECC logic that decoded the code from the first memory.

Further, as shown in operation 114, it is determined whether the error in the code is correctable. This may be performed by the decoder of the ECC logic. As shown in operations 116-120, responsive to determining that the error in the code is correctable: the error in the code is corrected to form a corrected code (operation 116), the data is retrieved from the second memory (operation 118), and the retrieved data is verified using the corrected code (operation 120). Accordingly, when the code is corrected, it may be utilized for verifying, and even correcting when necessary, the data.

As shown in operation 122, responsive to determining that the error in the code is not correctable, the error in the code is indicated as not being correctable. Thus, the erroneous code may be prevented from being utilized for verifying, and further erroneously correcting, the data. To this end, the method 100 may guarantee the integrity of any error correction performed on the data, particularly in the presence of faults in the ECC logic.

More illustrative information will now be set forth regarding various optional architectures and features with which the foregoing framework may be implemented, per the desires of the user. It should be strongly noted that the following information is set forth for illustrative purposes and should not be construed as limiting in any manner. Any of the following features may be optionally incorporated with or without the exclusion of other features described.

Figure 1B:
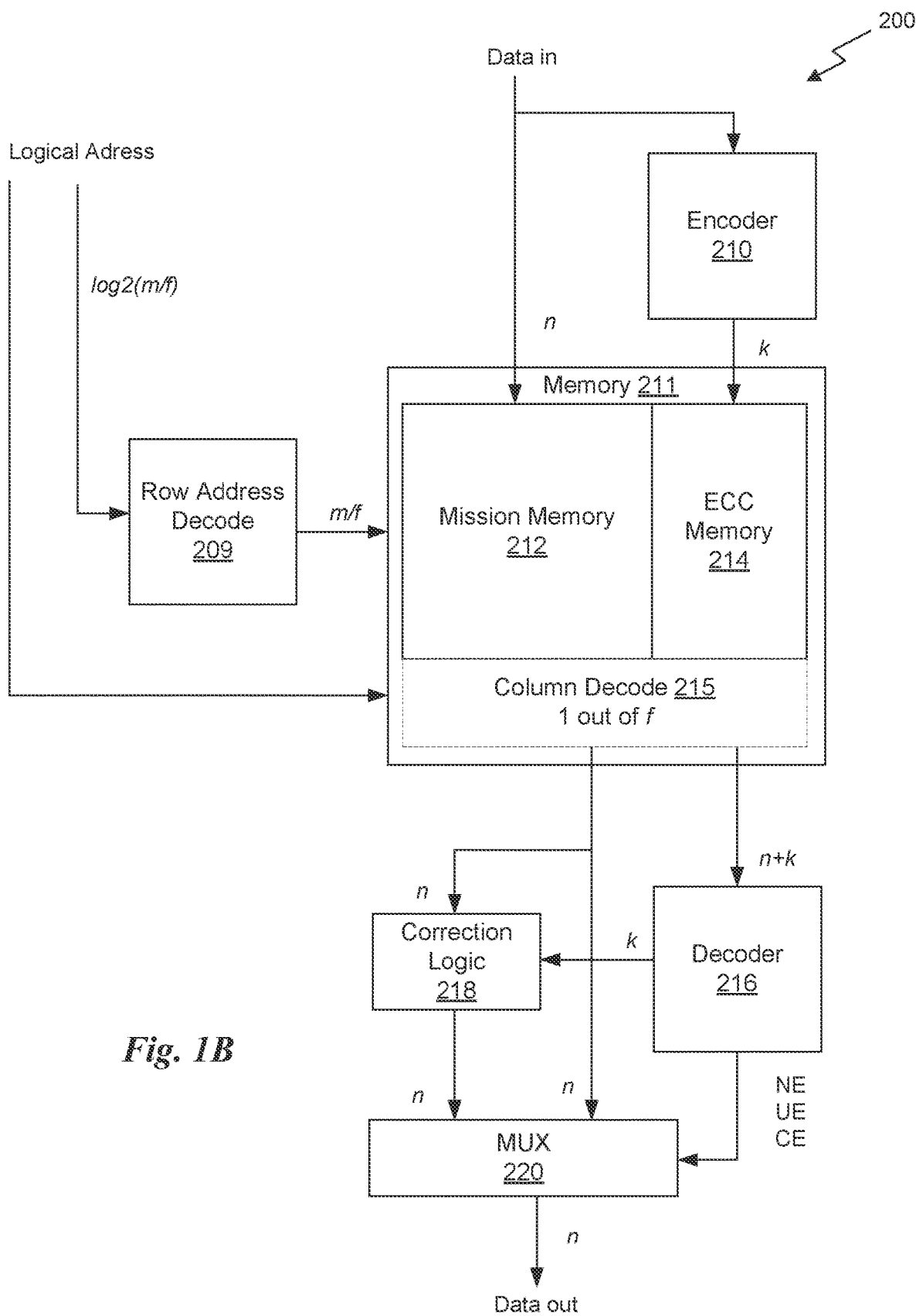
FIG. 1B illustrates a block diagram of an ECC logic architecture, in accordance with an embodiment.

FIG. 1B illustrates a block diagram of an ECC logic architecture 200, in accordance with an embodiment. The ECC logic architecture 200 may be configured to perform the method 100 of FIG. 1A.

As shown, input data (Data In), which is n bits wide, and ECC (calculated by the Encoder 210), which is k bits wide, are stored in Mission Memory 212 and ECC Memory 214 respectively. In the present embodiment, the Mission Memory 212 and ECC Memory 214 are different fields of a same physical Memory 211. The Memory 211 has m logical locations that form a memory array with each location comprising n+k bits of encoded data. The total capacity of memory is m(n+k) bits. The structure of the memory array is with column decoding factor f.

The Decoder 216 decodes the read-out n+k bit encoded data from the ECC Memory 214, and generates a k-bit syndrome and up to three possible error indicators: no error (NE), correctable error (CE), and uncorrectable error (UE). The Correction Logic 218 uses the k-bit syndrome to correct the n-bit read-out data from the Mission Memory 212 when the error indicator output by the Decoder 216 is CE, which indicates the correctable error condition. The CE output of the Decoder 216 controls the multiplexing (MUX) unit 220 of the unmodified data from the Mission Memory 212 and the corrected data from the Correction Logic 218. The MUX 220 and Correction Logic 218 can be merged into a single unit but is shown here separately to do a more conservative accounting of faults. Depending on the design parameter values, the ECC logic architecture 200 could be SED (as in parity), SEC or SEC-DED, as described below.

SED (or Parity): This is when k=1 and the Encoder 210 and Decoder 216 are XOR parity trees. In this design, the Decoder 216 only signals NE and UE and there is no Correction Logic 218 and MUX 220 unit (separate from the embodiment shown in FIG. 1B).

SEC: For a given n, k is chosen such that $2^k-1 \geq n+k$ and $2^{k-1}-1 < n+k-1$. For example, if n=32 then k=6. $(2^5-1)<(32+5)$ and $(2^6-1) \geq (32+6)$. In this design of the ECC logic architecture 200, the Decoder 216 only signals NE and CE. The Encoder 210 and Decoder 216 are designed through special parity check equations specified by parity check matrix. This is described in further detail in "Error-Control Coding for Computer Systems," by T. R. N. Rao & E. Fujiwara, Prentice Hall Series in Computer Engineering, Prof. Edward J. McCluskey Series Editor, 1989, New Jersey. The ECC logic architecture 200 may optionally be configured to only to detect errors; in which case, the SEC code becomes double error detecting (DED) code and the Decoder 216 only signals NE and UE, and, as in SED code, there is no Correction Logic 218 and MUX 220 unit.

SEC-DED: The (n,k) SEC code chosen as described above is augmented to (n,k+1) SEC-DED code. The Encoder 210 and Decoder 216 has extra parity check equations for the extra check bit, as described in "Error-Control Coding for Computer Systems" mentioned above. The SEC-DED code can be used as a triple error detecting (TED) code.

ECC protection on bus interface structures (not shown) is a special case of FIG. 1B, where there is no need for the memory array and the row/column decoders. Here the Encoder 210 is at the data source level and the Decoder 216 and Correction Logic 218 is at the target of the bus interface.

Figure 1C:
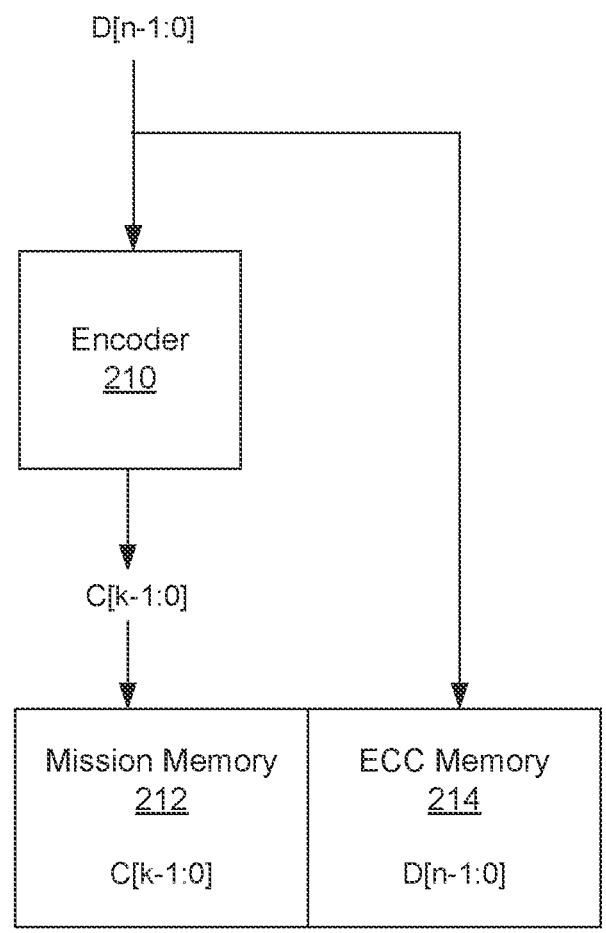
FIG. 1C illustrates a block diagram of the input and output of the ECC encoder of FIG. 1B, in accordance with an embodiment.
Figure 2A:
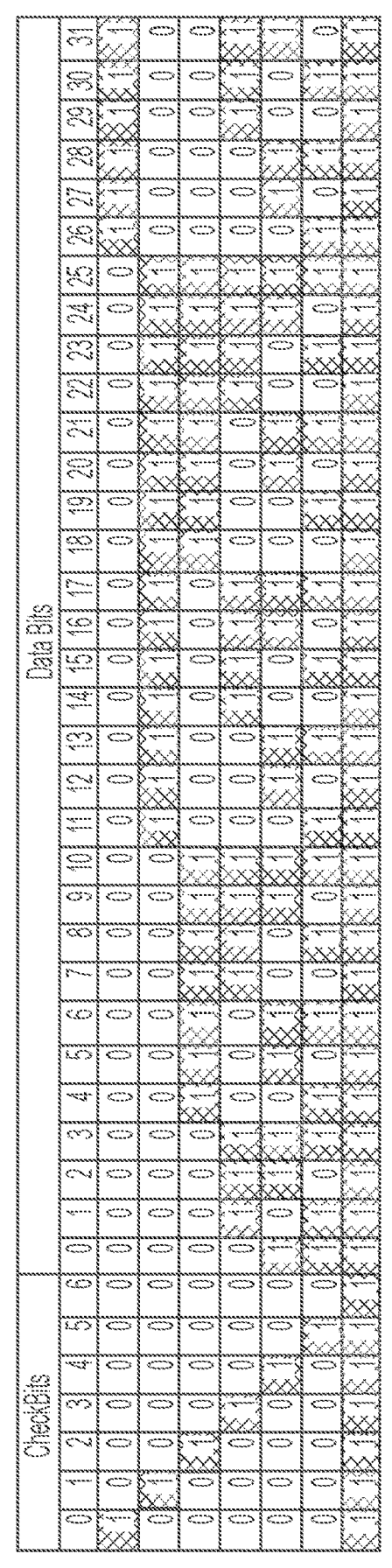

FIG. 1C illustrates a block diagram of the input and output of the ECC Encoder 210 of FIG. 2A, in accordance with an embodiment. ECC designs are based on the theoretical structure of linear error correcting codes and use eXclusive-OR (XOR) logic gate implementations. Linear code based ECC designs have three structural components:

Encoder 210 computes ECC, i.e. k check bits C[k−1:0] from n data bits D[n−1:0]). The computed check bits along with the data bits are stored together in ECC Memory 214 and Mission Memory 212, respectively.

Figure 1D:
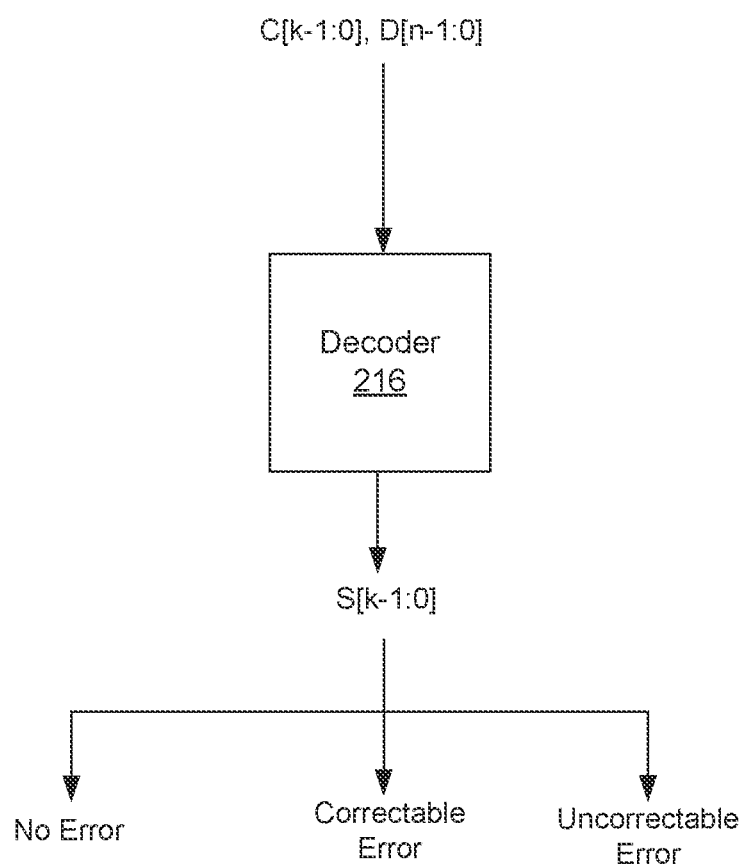
FIG. 1D illustrates a block diagram of the input and output of the ECC decoder of FIG. 1B, in accordance with an embodiment.

FIG. 1D illustrates a block diagram of the input and output of the ECC Decoder 216 of FIG. 2A, in accordance with an embodiment. Decoder 216 takes as input the encoded codeword (represented by C[k−1:0], D[n−1:0]) and through an intermediate k-bit output called syndrome (S[k−1:0]) determines if there is no error (NE), correctable error (CE), or uncorrectable error (UE). NE, CE, UE are mutually exclusive in that the valid outcomes are (NE, CE, UE)=(1, 0,0), (0,1,0), or (0,0,1).

Correction Logic 218 uses Decoder 216 output (S[k−1]:0) and the CE signal to produce a corrected data CD[n−1:0] (in case of correctable errors as indicated by CE=1) or preserves the original data in case CE=0.

In ISO 26262 nomenclature, for example, the ECC logic architecture 200 in FIG. 1B is considered as a safety mechanism in automotive safety-related electronic systems. In this embodiment and others, it can be used to detect, and in some cases correct, errors in data resulting from hardware faults. However, faults in the ECC logic itself can introduce errors into the ECC that is otherwise meant to protect the data. In particular, permanent faults in the Encoder 210 and/or Decoder 216 can lead to data corruption without triggering an appropriate detection mechanism.

To secure against errors introduced by faults in the ECC logic itself, the ECC logic and/or code can be constrained in multiple ways.

Embodiment 1—SEC ECC Logic Constraint for Encoder

For ECC logic that produces a SEC code, the ECC logic can be made fault-secure with respect to all single-stuck at faults if the ECC logic is constrained such that there is no sharing of common sub-expressions in the Encoder 210 for respective checkbit outputs: C[0], C[1], . . . , C[k−1]. While this Encoder 210 increases area and power overhead, it guarantees that any single stuck-at fault in the Encoder 210 will at most corrupt a single checkbit output, and that any decoding of this corrupted result (i.e., only a single checkbit error) will correct the same corrupted checkbit value.

Embodiment 1—Example

For linear error detecting and correcting codes, includes SEC codes, the checkbit encoders are defined by the parity check matrix $[I_{k \times k} P_{k \times n}]$, where the identity matrix represents the checkbit positions C[0] through C[k−1] in the respective k rows; and, the parity matrix in every row identifies the data bits forming the parity equations for the corresponding checkbit. The parity check matrix illustrated in Table 1 below defines a (11, 4) SEC code with n=11 data bits and k=4 check bits.

TABLE 1

$$\text{Parity check matrix } H = \begin{bmatrix} C[0 \ldots 3]D[0 \ldots 10] \\ 100010011101101 \\ 010011001010111 \\ 001011100101011 \\ 000101110110101 \end{bmatrix}$$

The first 4×4 identity sub-matrix in H corresponds to the four checkbits C[0] through C[3]. The following 4×11 sub-matrix corresponds to the data inputs D[0] through D[10]. The checkbit equations are canonically derived from the parity check matrix as follows:

1. In each row of the matrix H, the first non-zero bit at location i identifies the checkbit C[i−1] and every subsequent non-zero bit j1, j2, . . . , identifies data bits D[j1-k], D[j2-k], . . . respectively.

2. The parity equations for each row of the matrix H is formed by taking the identified checkbit C[i−1] on the left hand side and equating it to the modulo-2 (XOR) sum of the identified data bits D[j1-k], D[j2-k], . . . respectively.

Following the above process we get the parity equations shown in Table 2 for the (15, 4) code. Here '+' denotes modulo-2 summation.

TABLE 2

C[0] = D[0] + D[3] + D[4] + D[5] + D[7] + D[8] + D[10]
C[1] = D[0] + D[1] + D[4] + D[6] + D[8] + D[9] + D[10]
C[2] = D[0] + D[1] + D[2] + D[5] + D[7] + D[9] + D[10]
C[3] = D[1] + D[2] + D[3] + D[5] + D[6] + D[8] + D[10]

In the prior art, ECC logic encoders would share common sub-expressions in the parity equations. For example D

[0]+D [10] is a common sub-expression in equations for C[0], C [1], and C [2] respectively, which can be implemented by the sharing of XOR (with inputs D[0] and D[10]) gate output with the logic structures that produce outputs C[0], C[1], and C[2].

If the fault-free data D[0 . . . 10]=11'b00000000000 then, in the absence of faults, the checkbits C[0 . . . 3]=4'b0000. However, with a stuck-at-1 fault at the fan-out stem node of the XOR gate with inputs D[0] and D[10], the checkbits compute to C[0 . . . 3]=4'b0110. If this is decoded (the decoded value would indicate single bit error correction (CE) in data field) the data value will be incorrectly corrected as D[0 . . . 10]=11'b00000000010. While the checkbit encoder is self-checking (meaning the fault is detected by the decoder) with respect to this fault it is not fault-secure in that the detected error causes silent data corruption (SDC) as the SEC code does not signal uncorrectable error (UE) and can result in violation of a safety goal.

By constraining the ECC logic, in accordance with the description above, if a single stuck-at-1 fault effects C[0] part of the encoder logic then data value D[0 . . . 10]=11'b00000000000 will result in checkbits to C[0 . . . 3]=4'b1000. Upon decoding and correction of the checkbits the read out checkbit and data value would be {C[0 . . . 3]|D[0 . . . 10]}={4'b0000|11'b00000000000}

Embodiment 2—SEC-DED ECC Logic Constraint for Encoder

For ECC logic that produces a SEC-DED code, the ECC logic can be made fault-secure with respect to all single-stuck at faults if the ECC logic is constrained such that there is no sharing of more than two common sub-expressions in the Encoder 210 for respective checkbit outputs: C[0], C[1], . . . , C[k−1]. While this Encoder 210 constraint increases some area overhead, it guarantees that any single stuck-at fault in the Encoder 210 will at most corrupt two checkbit outputs, and that any decoding of this corrupted result (i.e., at most two checkbit errors) will either correct the same corrupted checkbit value or decode the error as uncorrectable (UE).

Embodiment 2—Example

For a (11, 5) SEC-DED code augmented from a (11, 4) SEC code using an extra checkbit, the parity check matrix H and the corresponding checkbit equations for this SEC-DED code are given in Table 3 below.

TABLE 3

$$\text{Parity check matrix } H = \begin{bmatrix} C[0 \ldots 4]D[0 \ldots 10] \\ 1000010011101101 \\ 0100011001010111 \\ 0010011100101011 \\ 0001001110110101 \\ 0000100111011011 \end{bmatrix}$$

C[0] = D[0] + D[3] + D[4] + D[5] + D[7] + D[8] + D[10]
C[1] = D[0] + D[1] + D[4] + D[6] + D[8] + D[9] + D[10]
C[2] = D[0] + D[1] + D[2] + D[5] + D[7] + D[9] + D[10]
C[3] = D[1] + D[2] + D[3] + D[5] + D[6] + D[8] + D[10]
C[4] = D[2] + D[3] + D[4] + D[6] + D[7] + D[9] + D[10]

In the prior art, ECC logic encoders would share common sub-expressions in the parity equations. For example, D [0]+D [10] is a common sub-expression in equations for C[0], C[1], and C[2] respective by the sharing of XOR (with inputs D[0] and D[10]) gate output with the logic structures that produce outputs C[0], C [1], and C [2].

If the fault-free data D[0 . . . 10]=11'b00000000000 then, in the absence of faults, the checkbits C[0 . . . 3]=4'b0000. However, with a stuck-at-1 fault at the output of the XOR gate with inputs D[0] and D[10], checkbits compute to C[0 . . . 3]=4'b11100. If this is decoded (the decoded value would indicate single bit error correction in data field) the data value will be incorrectly corrected as D[0 . . . 10]=11'b 10000000000. However, if we assume a fan-out stem fault as in the SEC ECC logic design described above corrupting only C[1] and C[2], then the decoder will signal an uncorrectable error (UE) and will not cause residual faults.

By constraining the ECC logic, in accordance with the description above, if a single stuck-at-1 fault effects C[0] part of the encoder logic then data value D[0 . . . 10]=11'b00000000000 will result in checkbits to C[0 . . . 4]=5'b10000. Upon decoding and correction of the checkbits the read out checkbit and data value would be {C[0 . . . 4]|D[0 . . . 10]}={5'b00000|11'b00000000000}. In addition, if a single stuck-at fault effects C[0] & C[1] part of the encoder logic then data value D[0 . . . 10]=11'b00000000000 will result in checkbits to C[0 . . . 3]=5'b11000. The decoder will signal this case as uncorrectable double-bit error (UE).

Embodiment 3—Parity Bit ECC Logic

Parity based encoders output SED codes and by definition they are fault-secure in that they produce only one checkbit C[0]. Any fault in the encoder will either corrupt C[0] or not. In either case, the decoder signals uncorrectable error or does not signal error. The only downside of this is that it can cause a false-positive situation and can impact availability.

Embodiment 4—ECC Logic Constraint for Decoder

For internal single-stuck at faults in the Decoder 216, if guidelines like the Encoder 210 design are followed then the syndrome logic is fault-secure with respect to internal stuck at faults. In particular, the SEC decoder design will be like that illustrated in FIG. 1D with the exception that there will be no uncorrectable error (UE) decoding logic. So, with respect to single stuck-at fault-secure property, the Decoder 216 logic can follow similar design guidelines as the Encoder 210 logic.

For a single bit parity decoder, the Decoder 216 is a single output parity tree and the no-error (NE) output also corresponds to the output of the parity tree.

Embodiment 5—Modified Algorithm for ECC Logic

In the present embodiment, ECC code design techniques are described that can enhance the fault-secure property of the ECC without requiring any help from ECC logic design constraints described in the embodiments above.

To explain the code design techniques that improve fault-secure properties, let us first look at the sources of residual faults in a regular SEC-DED design. The seed for all ECC designs is the parity check matrix. This was shown in the previous sections by constructing the encoder and decoder equations from the parity check matrix defining (11,4) and (11,5) ECC codes respectively. FIG. 2A shows a construction of the parity check matrix of a standard (32,7) Hamming ECC code, as described in "Error-Control Coding for Computer Systems," by T. R. N. Rao & E. Fujiwara, Prentice Hall Series in Computer Engineering, Prof. Edward J. McCluskey Series Editor, 1989, New Jersey. The 6×6 identity sub-matrix in the beginning of this parity check matrix represents bits C[0] through C[5]. The remaining 32 length 6 column vectors for data bits D[0] through D[31] are filled out in increasing non-zero values and by skipping weight-1 columns already selected for check bits in the 6×6 identity sub-matrix. For example the column vector $[0\ 0\ 0\ 0\ 1\ 1]^T$ starts with decimal value 3 for D[0] (skipping values 1 and 2 already selected for C[5] and C[2]) and then column vector $[0\ 0\ 0\ 1\ 0\ 1]^T$ with decimal value 5 for D[1] (skipping value 4 already selected for C[3]). This construction gives a (32,6) SEC code design with check bits C[0] through C[5]. To get SEC-DED code design an additional check bit C[6] is added represented by column vector $[0\ 0\ 0\ 0\ 0\ 1]^T$. This C[6] check bit is the overall parity of check bits C[0] through C[5] and data bits D[0] through D[31].

Figure 2B:
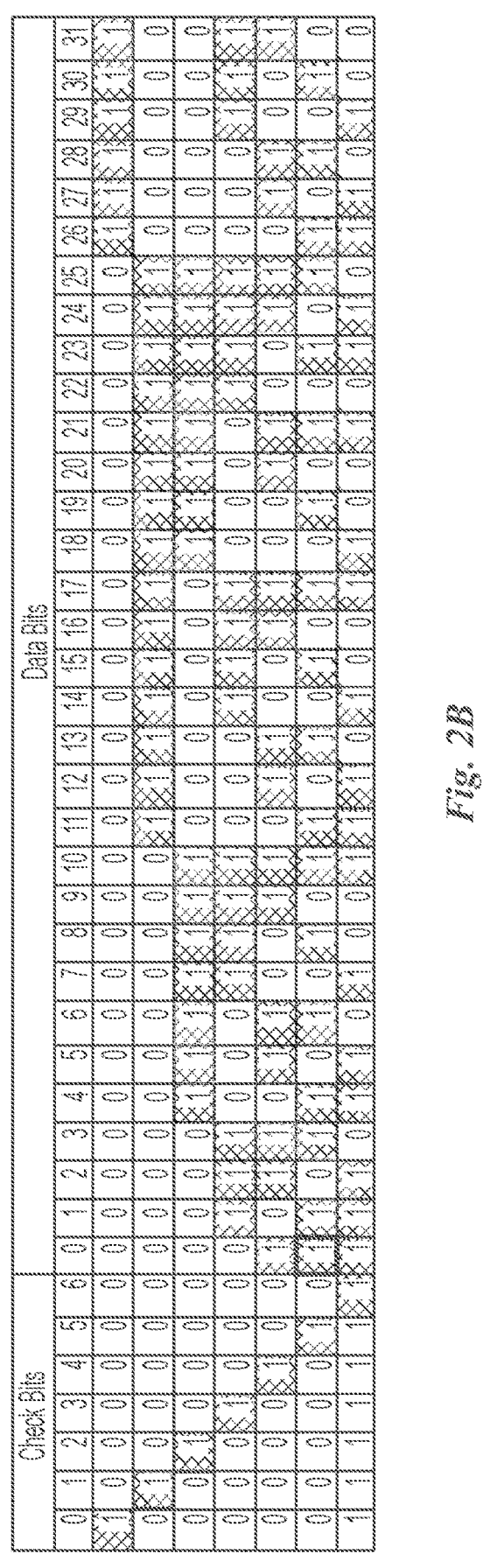
Figure 2D:
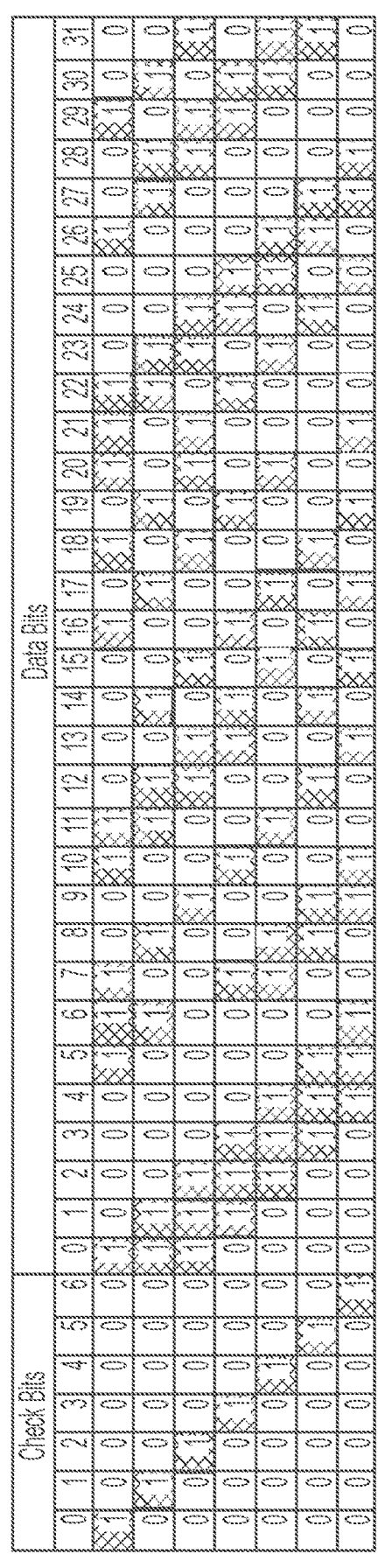
Figure 2E:
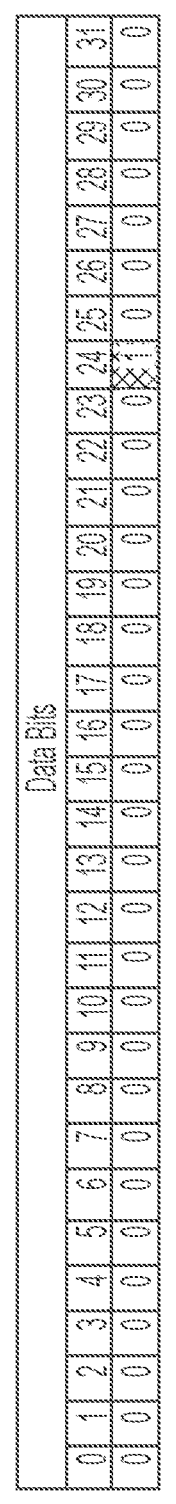

This parity check matrix is transformed into a systematic form where the check bit C[6] equation is recomposed to show only as a function of data bit subset in D[0] through D[31]. The trick to obtain last row Row[6] in the parity check matrix of FIG. 2E is to do the following bit by bit operation: Row[6] (in FIG. 7)=Bit by Bit XOR of rows Row[0] through Row[6] in FIG. 6.

One interesting consequence of a systematic (n,k) SEC-DED construction is that all columns in the parity check matrix have odd-weight. From the parity check matrix structure, it is also possible to predict what combination of three of more check bit equations share common XOR sub-expressions of data bits. This is easily accomplished by bit-wise AND-ing of the rows corresponding to the checkbit positions. The resulting row vector with corresponding ones in data bit locations will point to the common subexpression. For example, FIG. 2B shows the common subexpression for Checkbits 3, 4, 6 in the systematic (32,7) SEC-DED code.

By enumerating all possible sharing scenarios, we can approximately estimate that there are about 40 residual faults out of a total 448 faults in the SEC-DED encoder. This is about 8.9%. Since SEC-DED decoder shares a similar design we can expect similar population of residual faults. The local DC coverage is still greater than 91%; however, the overall diagnostic coverage of the safety mechanism could fall below 90% (when we include faults in the row address decoder and MUX units).

One of the key source of common sub-expression is the occurrence of odd-weight columns with weight greater than 3. Six out of 32 data bit columns in the parity check matrix of FIG. 2C have weight 5.

It is possible to construct SEC-DED parity check matrices with a systematic selection of lowest odd-weight columns. This is the basis of code construction algorithms popularized by Hsiao, as described in "Error-Control Coding for Computer Systems," by T. R. N. Rao & E. Fujiwara, Prentice Hall Series in Computer Engineering, Prof. Edward J. McCluskey Series Editor, 1989, New Jersey. The motivation for this is to minimize the number of XOR gates (and therefore the number of logic levels) in the encoder and decoder circuits. It is our recent finding that picking lowest odd-weight columns also helps in minimizing the sharing of common sub-expressions in the encoder and decoder logic. For example, most of the (n,k) SEC-DED codes can be generated by only using weight-3 columns. FIG. 2D shows one such (32,7) SEC-DED code.

If there are only weight-3 columns it turns out that there cannot be any sub-expression sharing in three or more check bit or syndrome outputs. For example, FIG. 2E shows that only data bit D[24] is common between check bits C[3], C[4], and C[6] and no common XOR subexpressions.

This results in zero residual faults out of a total of 448 faults in the encoder. Thereby accomplishing 100% local diagnostic coverage with respect to single stuck-at faults in encoders and decoders of ECC logic designs.

Next we show a formal method of generating SEC-DED parity check matrix using a modified version of Hsiao's algorithm.

1. Given data width n bits determine check bit length k such that: $(2^{k-1}-1) \geq (n+k-1)$ and $(2^{k-2}-1) < (n+k-2)$.
2. Generate k×k identity matrix for the check bits.
3. Set odd-weight w=3, code length c=n.
4. Iterate distinct weight w columns up to min of c and $$\binom{k}{w}.$$

5. If $$\binom{k}{w} \geq c$$

then all parity matrix columns generated. Go to 7.
6. Set $$c = c - \binom{k}{w}$$

and w=w+2. Go to 4.
7. All parity check matrix columns generated. Stop.

While some of the SEC-DED codes (like (32,7)) can be realized by weight-3 parity check matrix there will be scenarios where odd-weights greater than 3 are used. For example, for n=256 step 1 determines k=10. Binomial 10 choose 3=120<256 so remaining 136 weight-5 columns are used. To mitigate this problem, either the above described ECC logic constraints can be used or increase the value of k to realize the parity check matrix with only weight-3 columns. For example, if k=13 then it is possible to have (256,13) SEC-DED code with only weight-3 columns in the parity check matrix.

The embodiments described above to secure the ECC against errors include various fault-secure ECC logic designs that improve the overall reliability of an electronic system employing ECC logic as compared to conventional ECC designs. Once the ECC logic of an electronic system is made more reliable and resilient to faults, the ECC logic can be more trusted to perform its intended function of detecting and correcting errors in data.

Thus, the fault-secure ECC logic designs may be employed in memory structures, in data transmission systems, in processors, and in other systems where greater resiliency to data errors is desired. Such systems include, for example, autonomous and semi-autonomous vehicles such as automobiles, airplanes, boats, submarines; autonomous and semi-autonomous drones; security systems; robots; and other electronic systems including those that are exposed to external elements or extreme conditions capable of causing hardware faults.

The fault-secure ECC logic designs can also be employed in systems that incorporate artificial intelligence ("AI") where greater resiliency to data (bit) errors is desired. Such systems include, for example, AI-powered passenger vehicles, AI-powered robots in the medical, manufacturing, and industrial fields, AI-powered drones utilized in urban settings such as in package delivery, and AI-powered security systems.

For example, an automotive system for autonomous or semi-autonomous vehicles may use deep neural networks ("DNNs") for a variety of functions, including identifying lanes, objects, obstacles, pedestrians, and even occupants of the vehicle. Depending on their functions, execution of such DNNs by a processor on the vehicle may need greater resiliency to errors (including transient errors) to meet the overall safety requirements of the vehicle. Because a fault-secure ECC design is more resilient to errors than conventional ECC designs, substituting conventional ECC designs with fault-secure ECC designs in the vehicle's processor(s), memory structure(s) and data transmission system(s) will better protect the data utilized in the vehicle. Additionally, fault-secure ECC designs can be added to the vehicle's processor(s), memory structure(s), and data transmission system(s) to protect data that was not previously protected by ECC to increase the resiliency of such data in the vehicle. Consequently, incorporating fault-secure ECC designs in such vehicles will raise the overall reliability level of the data (including those applicable to its DNNs) to enable such vehicles to meet certain safety requirements including, for example, an Automotive Safety Integrity Level (ASIL) safety metric of the ISO 26262 standard. Furthermore, incorporating fault-secure ECC designs in the other aforementioned AI and non-AI based systems will similarly improve the reliability of the data utilized in such systems, and consequently the overall resiliency of such systems.

Parallel Processing Architecture

Figure 3:
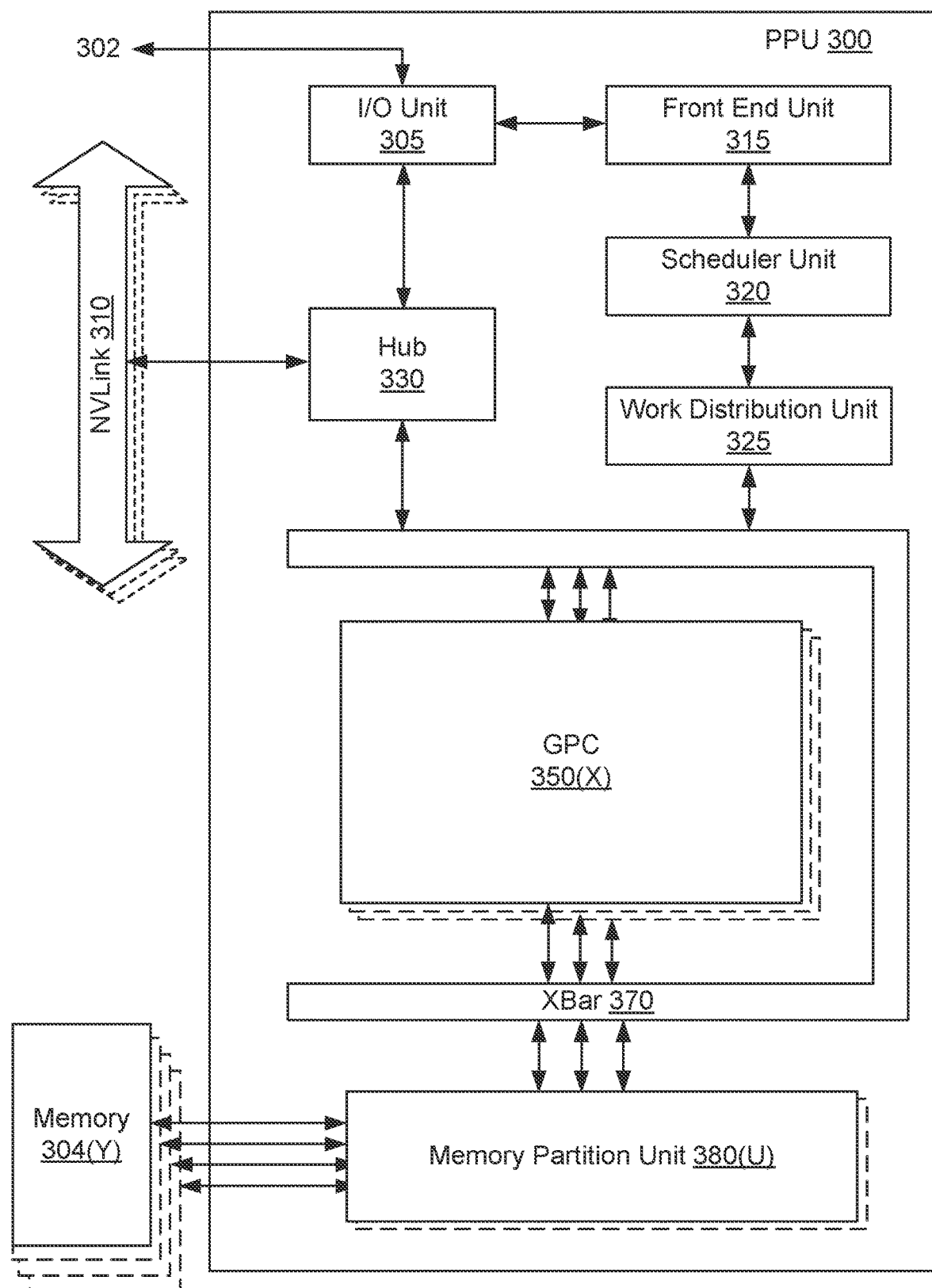
FIG. 3 illustrates a parallel processing unit, in accordance with an embodiment.

FIG. 3 illustrates a parallel processing unit (PPU) 300, in accordance with an embodiment. In an embodiment, the PPU 300 is a multi-threaded processor that is implemented on one or more integrated circuit devices. The PPU 300 is a latency hiding architecture designed to process many threads in parallel. A thread (i.e., a thread of execution) is an instantiation of a set of instructions configured to be executed by the PPU 300. In an embodiment, the PPU 300 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the PPU 300 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more PPUs 300 may be configured to accelerate thousands of High Performance Computing (HPC), data center, and machine learning applications. The PPU 300 may be configured to accelerate numerous deep learning systems and applications including autonomous vehicle platforms, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 3, the PPU 300 includes an Input/Output (I/O) unit 305, a front end unit 315, a scheduler unit 320, a work distribution unit 325, a hub 330, a crossbar (Xbar) 370, one or more general processing clusters (GPCs) 350, and one or more partition units 380. The PPU 300 may be connected to a host processor or other PPUs 300 via one or more high-speed NVLink 310 interconnect. The PPU 300 may be connected to a host processor or other peripheral devices via an interconnect 302. The PPU 300 may also be connected to a local memory comprising a number of memory devices 304. In an embodiment, the local memory may comprise a number of dynamic random access memory (DRAM) devices. The DRAM devices may be configured as a high-bandwidth memory (HBM) subsystem, with multiple DRAM dies stacked within each device.

The NVLink 310 interconnect enables systems to scale and include one or more PPUs 300 combined with one or more CPUs, supports cache coherence between the PPUs 300 and CPUs, and CPU mastering. Data and/or commands may be transmitted by the NVLink 310 through the hub 330 to/from other units of the PPU 300 such as one or more copy engines, a video encoder, a video decoder, a power management unit, etc. (not explicitly shown). The NVLink 310 is described in more detail in conjunction with FIG. 5B.

The I/O unit 305 is configured to transmit and receive communications (i.e., commands, data, etc.) from a host processor (not shown) over the interconnect 302. The I/O unit 305 may communicate with the host processor directly via the interconnect 302 or through one or more intermediate devices such as a memory bridge. In an embodiment, the I/O unit 305 may communicate with one or more other processors, such as one or more the PPUs 300 via the interconnect 302. In an embodiment, the I/O unit 305 implements a Peripheral Component Interconnect Express (PCIe) interface for communications over a PCIe bus and the interconnect 302 is a PCIe bus. In alternative embodiments, the I/O unit 305 may implement other types of well-known interfaces for communicating with external devices.

The I/O unit 305 decodes packets received via the interconnect 302. In an embodiment, the packets represent commands configured to cause the PPU 300 to perform various operations. The I/O unit 305 transmits the decoded commands to various other units of the PPU 300 as the commands may specify. For example, some commands may be transmitted to the front end unit 315. Other commands may be transmitted to the hub 330 or other units of the PPU 300 such as one or more copy engines, a video encoder, a video decoder, a power management unit, etc. (not explicitly shown). In other words, the I/O unit 305 is configured to route communications between and among the various logical units of the PPU 300.

In an embodiment, a program executed by the host processor encodes a command stream in a buffer that provides workloads to the PPU 300 for processing. A workload may comprise several instructions and data to be processed by those instructions. The buffer is a region in a memory that is accessible (i.e., read/write) by both the host processor and the PPU 300. For example, the I/O unit 305 may be configured to access the buffer in a system memory connected to the interconnect 302 via memory requests transmitted over the interconnect 302. In an embodiment, the host processor writes the command stream to the buffer and then transmits a pointer to the start of the command stream to the PPU 300. The front end unit 315 receives pointers to one or more command streams. The front end unit 315 manages the one or more streams, reading commands from the streams and forwarding commands to the various units of the PPU 300.

The front end unit 315 is coupled to a scheduler unit 320 that configures the various GPCs 350 to process tasks defined by the one or more streams. The scheduler unit 320 is configured to track state information related to the various tasks managed by the scheduler unit 320. The state may indicate which GPC 350 a task is assigned to, whether the task is active or inactive, a priority level associated with the task, and so forth. The scheduler unit 320 manages the execution of a plurality of tasks on the one or more GPCs 350.

The scheduler unit 320 is coupled to a work distribution unit 325 that is configured to dispatch tasks for execution on the GPCs 350. The work distribution unit 325 may track a number of scheduled tasks received from the scheduler unit 320. In an embodiment, the work distribution unit 325 manages a pending task pool and an active task pool for each of the GPCs 350. The pending task pool may comprise a number of slots (e.g., 32 slots) that contain tasks assigned to be processed by a particular GPC 350. The active task pool may comprise a number of slots (e.g., 4 slots) for tasks that are actively being processed by the GPCs 350. As a GPC 350 finishes the execution of a task, that task is evicted from the active task pool for the GPC 350 and one of the other tasks from the pending task pool is selected and scheduled for execution on the GPC 350. If an active task has been idle on the GPC 350, such as while waiting for a data dependency to be resolved, then the active task may be evicted from the GPC 350 and returned to the pending task pool while another task in the pending task pool is selected and scheduled for execution on the GPC 350.

The work distribution unit 325 communicates with the one or more GPCs 350 via XBar 370. The XBar 370 is an interconnect network that couples many of the units of the PPU 300 to other units of the PPU 300. For example, the XBar 370 may be configured to couple the work distribution unit 325 to a particular GPC 350. Although not shown explicitly, one or more other units of the PPU 300 may also be connected to the XBar 370 via the hub 330.

The tasks are managed by the scheduler unit 320 and dispatched to a GPC 350 by the work distribution unit 325. The GPC 350 is configured to process the task and generate results. The results may be consumed by other tasks within the GPC 350, routed to a different GPC 350 via the XBar 370, or stored in the memory 304. The results can be written to the memory 304 via the partition units 380, which implement a memory interface for reading and writing data to/from the memory 304. The results can be transmitted to another PPU 304 or CPU via the NVLink 310. In an embodiment, the PPU 300 includes a number U of partition units 380 that is equal to the number of separate and distinct memory devices 304 coupled to the PPU 300. A partition unit 380 will be described in more detail below in conjunction with FIG. 4B.

In an embodiment, a host processor executes a driver kernel that implements an application programming interface (API) that enables one or more applications executing on the host processor to schedule operations for execution on the PPU 300. In an embodiment, multiple compute applications are simultaneously executed by the PPU 300 and the PPU 300 provides isolation, quality of service (QoS), and independent address spaces for the multiple compute applications. An application may generate instructions (i.e., API calls) that cause the driver kernel to generate one or more tasks for execution by the PPU 300. The driver kernel outputs tasks to one or more streams being processed by the PPU 300. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. Threads and cooperating threads are described in more detail in conjunction with FIG. 5A.

Figure 4A:
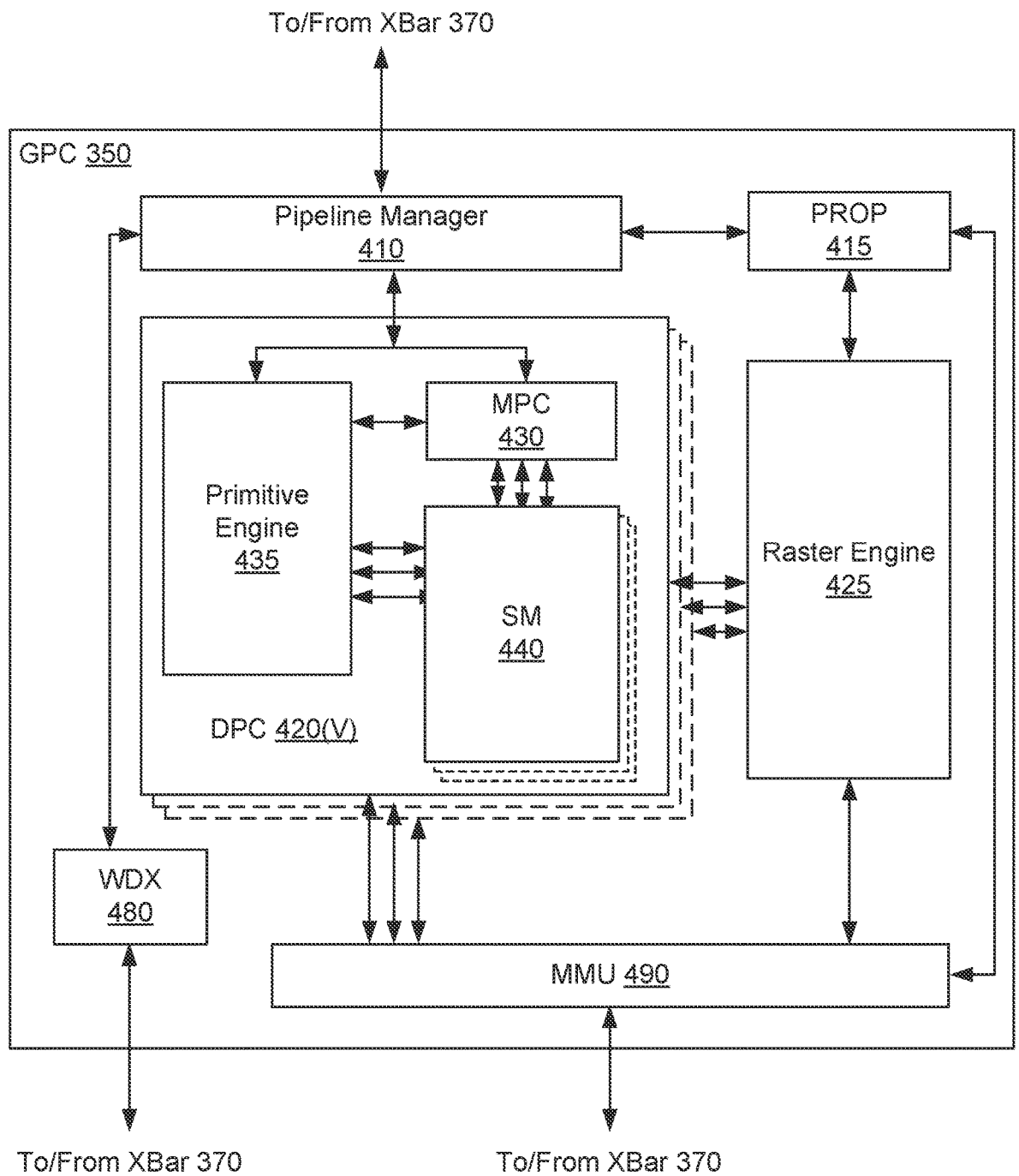
FIG. 4A illustrates a general processing cluster within the parallel processing unit of FIG. 3, in accordance with an embodiment.

FIG. 4A illustrates a GPC 350 of the PPU 300 of FIG. 3, in accordance with an embodiment. As shown in FIG. 4A, each GPC 350 includes a number of hardware units for processing tasks. In an embodiment, each GPC 350 includes a pipeline manager 410, a pre-raster operations unit (PROP) 415, a raster engine 425, a work distribution crossbar (WDX) 480, a memory management unit (MMU) 490, and one or more Data Processing Clusters (DPCs) 420. It will be appreciated that the GPC 350 of FIG. 4A may include other hardware units in lieu of or in addition to the units shown in FIG. 4A.

In an embodiment, the operation of the GPC 350 is controlled by the pipeline manager 410. The pipeline manager 410 manages the configuration of the one or more DPCs 420 for processing tasks allocated to the GPC 350. In an embodiment, the pipeline manager 410 may configure at least one of the one or more DPCs 420 to implement at least a portion of a graphics rendering pipeline. For example, a DPC 420 may be configured to execute a vertex shader program on the programmable streaming multiprocessor (SM) 440. The pipeline manager 410 may also be configured to route packets received from the work distribution unit 325 to the appropriate logical units within the GPC 350. For example, some packets may be routed to fixed function hardware units in the PROP 415 and/or raster engine 425 while other packets may be routed to the DPCs 420 for processing by the primitive engine 435 or the SM 440. In an embodiment, the pipeline manager 410 may configure at least one of the one or more DPCs 420 to implement a neural network model and/or a computing pipeline.

Figure 4B:
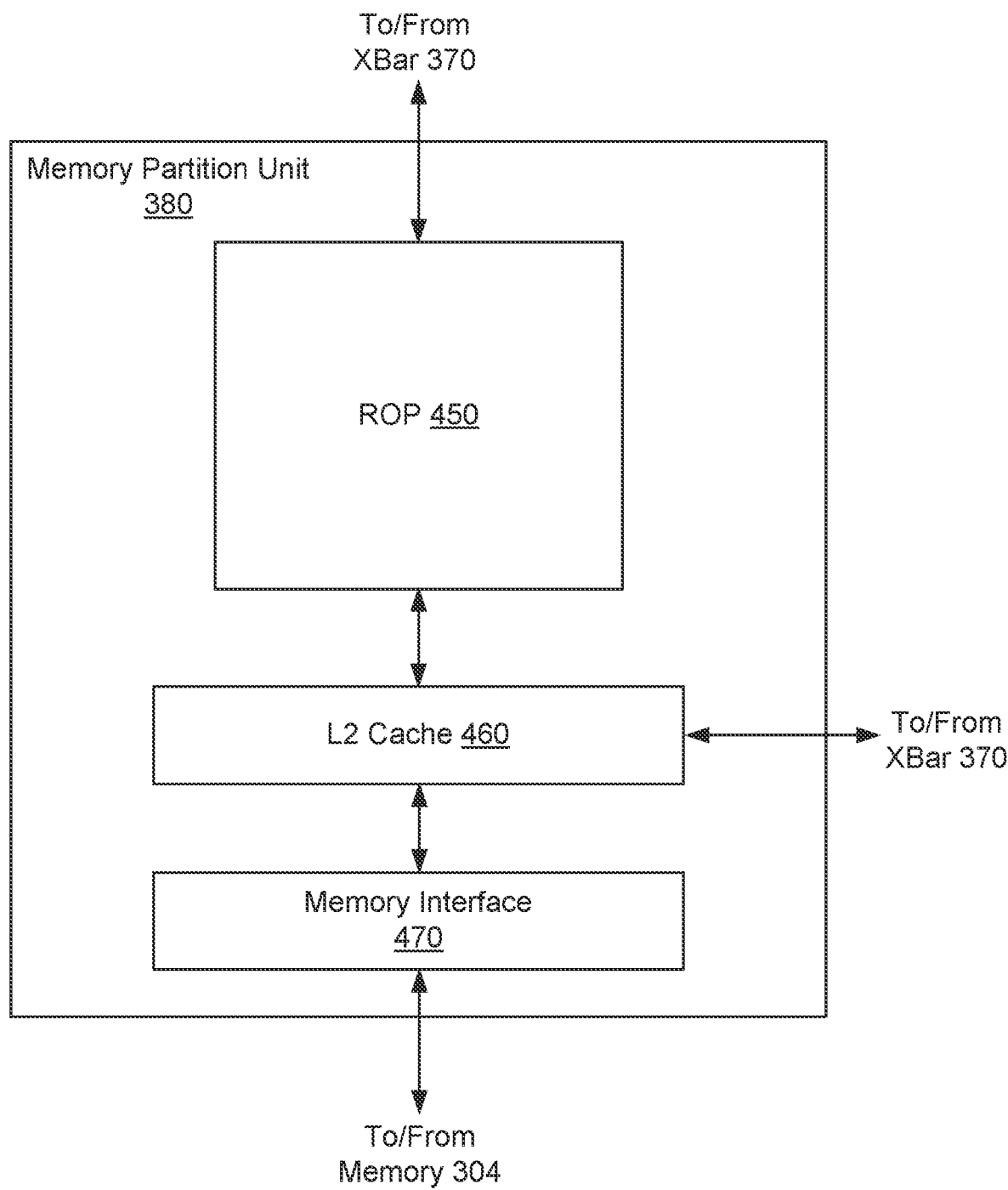
FIG. 4B illustrates a memory partition unit of the parallel processing unit of FIG. 3, in accordance with an embodiment.

The PROP unit 415 is configured to route data generated by the raster engine 425 and the DPCs 420 to a Raster Operations (ROP) unit, described in more detail in conjunction with FIG. 4B. The PROP unit 415 may also be configured to perform optimizations for color blending, organize pixel data, perform address translations, and the like.

The raster engine 425 includes a number of fixed function hardware units configured to perform various raster operations. In an embodiment, the raster engine 425 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x,y coverage mask for a tile) for the primitive. The output of the coarse raster engine is transmitted to the culling engine where fragments associated with the primitive that fail a z-test are culled, and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 425 comprises fragments to be processed, for example, by a fragment shader implemented within a DPC 420.

Each DPC 420 included in the GPC 350 includes an M-Pipe Controller (MPC) 430, a primitive engine 435, and one or more SMs 440. The MPC 430 controls the operation of the DPC 420, routing packets received from the pipeline manager 410 to the appropriate units in the DPC 420. For example, packets associated with a vertex may be routed to the primitive engine 435, which is configured to fetch vertex attributes associated with the vertex from the memory 304. In contrast, packets associated with a shader program may be transmitted to the SM 440.

The SM 440 comprises a programmable streaming processor that is configured to process tasks represented by a number of threads. Each SM 440 is multi-threaded and configured to execute a plurality of threads (e.g., 32 threads) from a particular group of threads concurrently. In an embodiment, the SM 440 implements a SIMD (Single-Instruction, Multiple-Data) architecture where each thread in a group of threads (i.e., a warp) is configured to process a different set of data based on the same set of instructions. All threads in the group of threads execute the same instructions. In another embodiment, the SM 440 implements a SIMT (Single-Instruction, Multiple Thread) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency. The SM 440 will be described in more detail below in conjunction with FIG. 5A.

The MMU 490 provides an interface between the GPC 350 and the partition unit 380. The MMU 490 may provide translation of virtual addresses into physical addresses, memory protection, and arbitration of memory requests. In an embodiment, the MMU 490 provides one or more translation lookaside buffers (TLBs) for performing translation of virtual addresses into physical addresses in the memory 304.

FIG. 4B illustrates a memory partition unit 380 of the PPU 300 of FIG. 3, in accordance with an embodiment. As shown in FIG. 4B, the memory partition unit 380 includes a Raster Operations (ROP) unit 450, a level two (L2) cache 460, and a memory interface 470. The memory interface 470 is coupled to the memory 304. Memory interface 470 may implement 32, 64, 128, 1024-bit data buses, or the like, for high-speed data transfer. In an embodiment, the PPU 300 incorporates U memory interfaces 470, one memory interface 470 per pair of partition units 380, where each pair of partition units 380 is connected to a corresponding memory device 304. For example, PPU 300 may be connected to up to Y memory devices 304, such as high bandwidth memory stacks or graphics double-data-rate, version 5, synchronous dynamic random access memory, or other types of persistent storage.

In an embodiment, the memory interface 470 implements an HBM2 memory interface and Y equals half U. In an embodiment, the HBM2 memory stacks are located on the same physical package as the PPU 300, providing substantial power and area savings compared with conventional GDDR5 SDRAM systems. In an embodiment, each HBM2 stack includes four memory dies and Y equals 4, with HBM2 stack including two 128-bit channels per die for a total of 8 channels and a data bus width of 1024 bits.

In an embodiment, the memory 304 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where PPUs 300 process very large datasets and/or run applications for extended periods.

In an embodiment, the PPU 300 implements a multi-level memory hierarchy. In an embodiment, the memory partition unit 380 supports a unified memory to provide a single unified virtual address space for CPU and PPU 300 memory, enabling data sharing between virtual memory systems. In an embodiment the frequency of accesses by a PPU 300 to memory located on other processors is traced to ensure that memory pages are moved to the physical memory of the PPU 300 that is accessing the pages more frequently. In an embodiment, the NVLink 310 supports address translation services allowing the PPU 300 to directly access a CPU's page tables and providing full access to CPU memory by the PPU 300.

In an embodiment, copy engines transfer data between multiple PPUs 300 or between PPUs 300 and CPUs. The copy engines can generate page faults for addresses that are not mapped into the page tables. The memory partition unit 380 can then service the page faults, mapping the addresses into the page table, after which the copy engine can perform the transfer. In a conventional system, memory is pinned (i.e., non-pageable) for multiple copy engine operations between multiple processors, substantially reducing the available memory. With hardware page faulting, addresses can be passed to the copy engines without worrying if the memory pages are resident, and the copy process is transparent.

Data from the memory 304 or other system memory may be fetched by the memory partition unit 380 and stored in the L2 cache 460, which is located on-chip and is shared between the various GPCs 350. As shown, each memory partition unit 380 includes a portion of the L2 cache 460 associated with a corresponding memory device 304. Lower level caches may then be implemented in various units within the GPCs 350. For example, each of the SMs 440 may implement a level one (L1) cache. The L1 cache is private memory that is dedicated to a particular SM 440. Data from the L2 cache 460 may be fetched and stored in each of the L1 caches for processing in the functional units of the SMs 440. The L2 cache 460 is coupled to the memory interface 470 and the XBar 370.

The ROP unit 450 performs graphics raster operations related to pixel color, such as color compression, pixel blending, and the like. The ROP unit 450 also implements depth testing in conjunction with the raster engine 425, receiving a depth for a sample location associated with a pixel fragment from the culling engine of the raster engine 425. The depth is tested against a corresponding depth in a depth buffer for a sample location associated with the fragment. If the fragment passes the depth test for the sample location, then the ROP unit 450 updates the depth buffer and transmits a result of the depth test to the raster engine 425. It will be appreciated that the number of partition units 380 may be different than the number of GPCs 350 and, therefore, each ROP unit 450 may be coupled to each of the GPCs 350. The ROP unit 450 tracks packets received from the different GPCs 350 and determines which GPC 350 that a result generated by the ROP unit 450 is routed to through the Xbar 370. Although the ROP unit 450 is included within the memory partition unit 380 in FIG. 4B, in other embodiment, the ROP unit 450 may be outside of the memory partition unit 380. For example, the ROP unit 450 may reside in the GPC 350 or another unit.

Figure 5A:
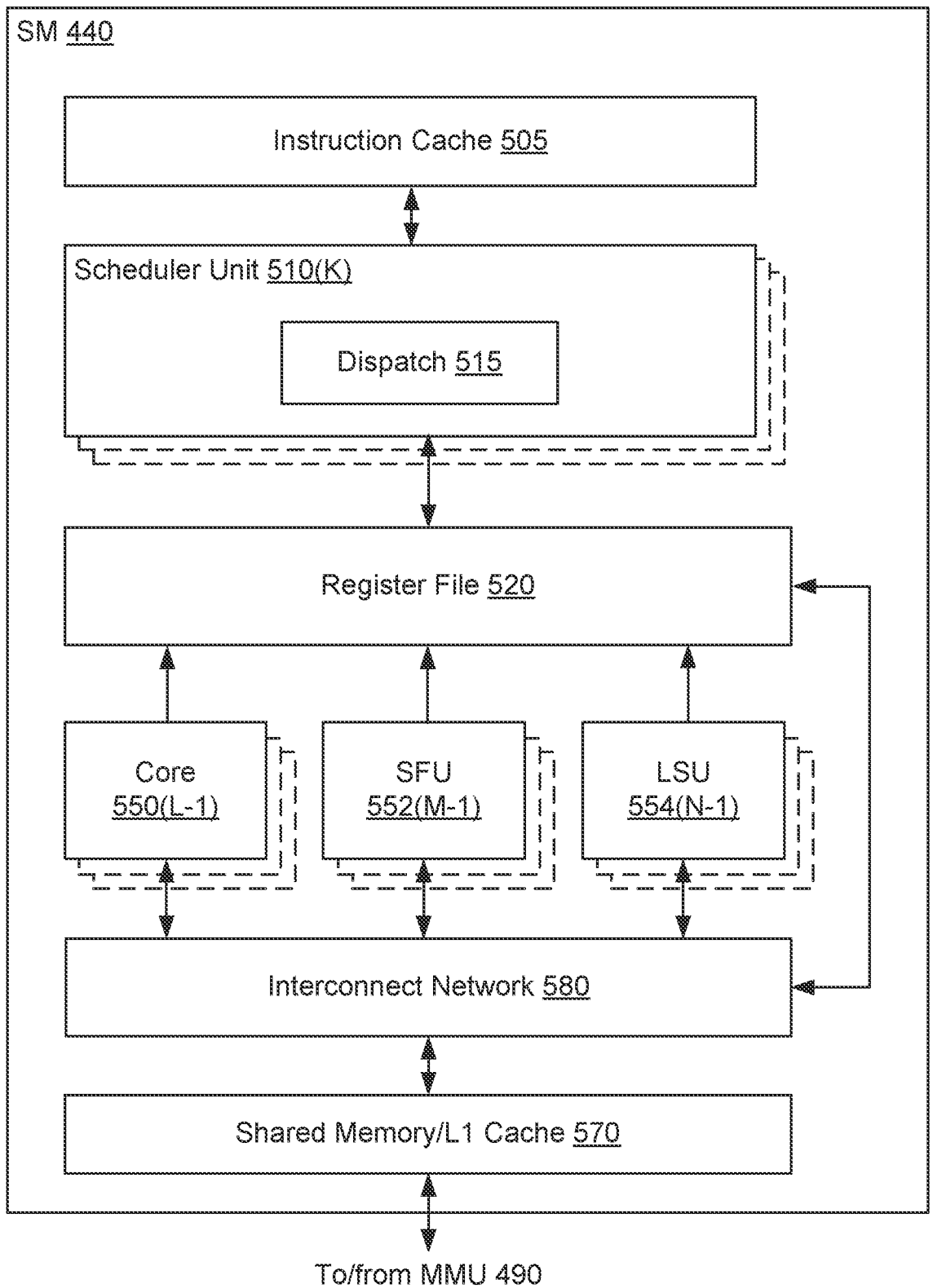
FIG. 5A illustrates the streaming multi-processor of FIG. 4A, in accordance with an embodiment.

FIG. 5A illustrates the streaming multi-processor 440 of FIG. 4A, in accordance with an embodiment. As shown in FIG. 5A, the SM 440 includes an instruction cache 505, one or more scheduler units 510, a register file 520, one or more processing cores 550, one or more special function units (SFUs) 552, one or more load/store units (LSUs) 554, an interconnect network 580, a shared memory/L1 cache 570.

As described above, the work distribution unit 325 dispatches tasks for execution on the GPCs 350 of the PPU 300. The tasks are allocated to a particular DPC 420 within a GPC 350 and, if the task is associated with a shader program, the task may be allocated to an SM 440. The scheduler unit 510 receives the tasks from the work distribution unit 325 and manages instruction scheduling for one or more thread blocks assigned to the SM 440. The scheduler unit 510 schedules thread blocks for execution as warps of parallel threads, where each thread block is allocated at least one warp. In an embodiment, each warp executes 32 threads. The scheduler unit 510 may manage a plurality of different thread blocks, allocating the warps to the different thread blocks and then dispatching instructions from the plurality of different cooperative groups to the various functional units (i.e., cores 550, SFUs 552, and LSUs 554) during each clock cycle.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (i.e., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (i.e., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch unit 515 is configured to transmit instructions to one or more of the functional units. In the embodiment, the scheduler unit 510 includes two dispatch units 515 that enable two different instructions from the same warp to be dispatched during each clock cycle. In alternative embodiments, each scheduler unit 510 may include a single dispatch unit 515 or additional dispatch units 515.

Each SM 440 includes a register file 520 that provides a set of registers for the functional units of the SM 440. In an embodiment, the register file 520 is divided between each of the functional units such that each functional unit is allocated a dedicated portion of the register file 520. In another embodiment, the register file 520 is divided between the different warps being executed by the SM 440. The register file 520 provides temporary storage for operands connected to the data paths of the functional units.

Each SM 440 comprises L processing cores 550. In an embodiment, the SM 440 includes a large number (e.g., 128, etc.) of distinct processing cores 550. Each core 550 may include a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the cores 550 include 64 single-precision (32-bit) floating point cores, 64 integer cores, 32 double-precision (64-bit) floating point cores, and 8 tensor cores.

Tensor cores configured to perform matrix operations, and, in an embodiment, one or more tensor cores are included in the cores 550. In particular, the tensor cores are configured to perform deep learning matrix arithmetic, such as convolution operations for neural network training and inferencing. In an embodiment, each tensor core operates on a 4×4 matrix and performs a matrix multiply and accumulate operation $D=A\times B+C$, where A, B, C, and D are 4×4 matrices.

In an embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each SM 440 also comprises M SFUs 552 that perform special functions (e.g., attribute evaluation, reciprocal square root, and the like). In an embodiment, the SFUs 552 may include a tree traversal unit configured to traverse a hierarchical tree data structure. In an embodiment, the SFUs 552 may include texture unit configured to perform texture map filtering operations. In an embodiment, the texture units are configured to load texture maps (e.g., a 2D array of texels) from the memory 304 and sample the texture maps to produce sampled texture values for use in shader programs executed by the SM 440. In an embodiment, the texture maps are stored in the shared memory/L1 cache 470. The texture units implement texture operations such as filtering operations using mip-maps (i.e., texture maps of varying levels of detail). In an embodiment, each SM 340 includes two texture units.

Each SM 440 also comprises N LSUs 554 that implement load and store operations between the shared memory/L1 cache 570 and the register file 520. Each SM 440 includes an interconnect network 580 that connects each of the functional units to the register file 520 and the LSU 554 to the register file 520, shared memory/L1 cache 570. In an embodiment, the interconnect network 580 is a crossbar that can be configured to connect any of the functional units to any of the registers in the register file 520 and connect the LSUs 554 to the register file and memory locations in shared memory/L1 cache 570.

The shared memory/L1 cache 570 is an array of on-chip memory that allows for data storage and communication between the SM 440 and the primitive engine 435 and between threads in the SM 440. In an embodiment, the shared memory/L1 cache 570 comprises 128 KB of storage capacity and is in the path from the SM 440 to the partition unit 380. The shared memory/L1 cache 570 can be used to cache reads and writes. One or more of the shared memory/L1 cache 570, L2 cache 460, and memory 304 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory/L1 cache 570 enables the shared memory/L1 cache 570 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 3, are bypassed, creating a much simpler programming model. In the general purpose parallel computation configuration, the work distribution unit 325 assigns and distributes blocks of threads directly to the DPCs 420. The threads in a block execute the same program, using a unique thread ID in the calculation to ensure each thread generates unique results, using the SM 440 to execute the program and perform calculations, shared memory/L1 cache 570 to communicate between threads, and the LSU 554 to read and write global memory through the shared memory/L1 cache 570 and the memory partition unit 380. When configured for general purpose parallel computation, the SM 440 can also write commands that the scheduler unit 320 can use to launch new work on the DPCs 420.

The PPU 300 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like. In an embodiment, the PPU 300 is embodied on a single semiconductor substrate. In another embodiment, the PPU 300 is included in a system-on-a-chip (SoC) along with one or more other devices such as additional PPUs 300, the memory 204, a reduced instruction set computer (RISC) CPU, a memory management unit (MMU), a digital-to-analog converter (DAC), and the like.

In an embodiment, the PPU 300 may be included on a graphics card that includes one or more memory devices 304. The graphics card may be configured to interface with a PCIe slot on a motherboard of a desktop computer. In yet another embodiment, the PPU 300 may be an integrated graphics processing unit (iGPU) or parallel processor included in the chipset of the motherboard.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 5B:
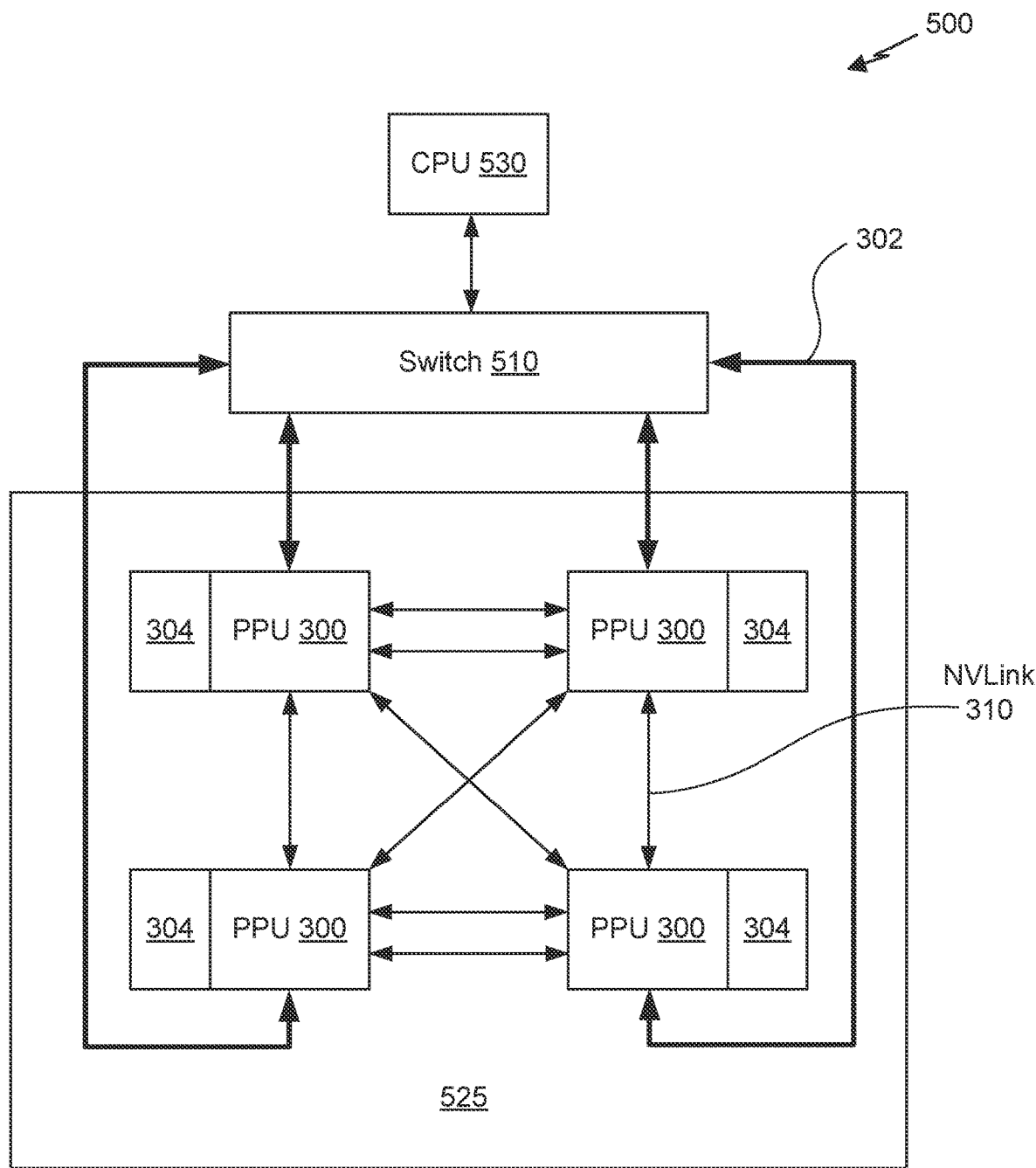
FIG. 5B is a conceptual diagram of a processing system implemented using the PPU of FIG. 3, in accordance with an embodiment.

FIG. 5B is a conceptual diagram of a processing system 500 implemented using the PPU 300 of FIG. 3, in accordance with an embodiment. The exemplary system 565 may be configured to implement the method 100 shown in FIG. 1A. The processing system 500 includes a CPU 530, switch 510, and multiple PPUs 300 each and respective memories 304. The NVLink 310 provides high-speed communication links between each of the PPUs 300. Although a particular number of NVLink 310 and interconnect 302 connections are illustrated in FIG. 5B, the number of connections to each PPU 300 and the CPU 530 may vary. The switch 510 interfaces between the interconnect 302 and the CPU 530. The PPUs 300, memories 304, and NVLinks 310 may be situated on a single semiconductor platform to form a parallel processing module 525. In an embodiment, the switch 510 supports two or more protocols to interface between various different connections and/or links.

In another embodiment (not shown), the NVLink 310 provides one or more high-speed communication links between each of the PPUs 300 and the CPU 530 and the switch 510 interfaces between the interconnect 302 and each of the PPUs 300. The PPUs 300, memories 304, and interconnect 302 may be situated on a single semiconductor platform to form a parallel processing module 525. In yet another embodiment (not shown), the interconnect 302 provides one or more communication links between each of the PPUs 300 and the CPU 530 and the switch 510 interfaces between each of the PPUs 300 using the NVLink 310 to provide one or more high-speed communication links between the PPUs 300. In another embodiment (not shown), the NVLink 310 provides one or more high-speed communication links between the PPUs 300 and the CPU 530 through the switch 510. In yet another embodiment (not shown), the interconnect 302 provides one or more communication links between each of the PPUs 300 directly. One or more of the NVLink 310 high-speed communication links may be implemented as a physical NVLink interconnect or either an on-chip or on-die interconnect using the same protocol as the NVLink 310.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 525 may be implemented as a circuit board substrate and each of the PPUs 300 and/or memories 304 may be packaged devices. In an embodiment, the CPU 530, switch 510, and the parallel processing module 525 are situated on a single semiconductor platform.

In an embodiment, the signaling rate of each NVLink 310 is 20 to 25 Gigabits/second and each PPU 300 includes six NVLink 310 interfaces (as shown in FIG. 5B, five NVLink 310 interfaces are included for each PPU 300). Each NVLink 310 provides a data transfer rate of 25 Gigabytes/second in each direction, with six links providing 300 Gigabytes/second. The NVLinks 310 can be used exclusively for PPU-to-PPU communication as shown in FIG. 5B, or some combination of PPU-to-PPU and PPU-to-CPU, when the CPU 530 also includes one or more NVLink 310 interfaces.

In an embodiment, the NVLink 310 allows direct load/store/atomic access from the CPU 530 to each PPU's 300 memory 304. In an embodiment, the NVLink 310 supports coherency operations, allowing data read from the memories 304 to be stored in the cache hierarchy of the CPU 530, reducing cache access latency for the CPU 530. In an embodiment, the NVLink 310 includes support for Address Translation Services (ATS), allowing the PPU 300 to directly access page tables within the CPU 530. One or more of the NVLinks 310 may also be configured to operate in a low-power mode.

Figure 5C:
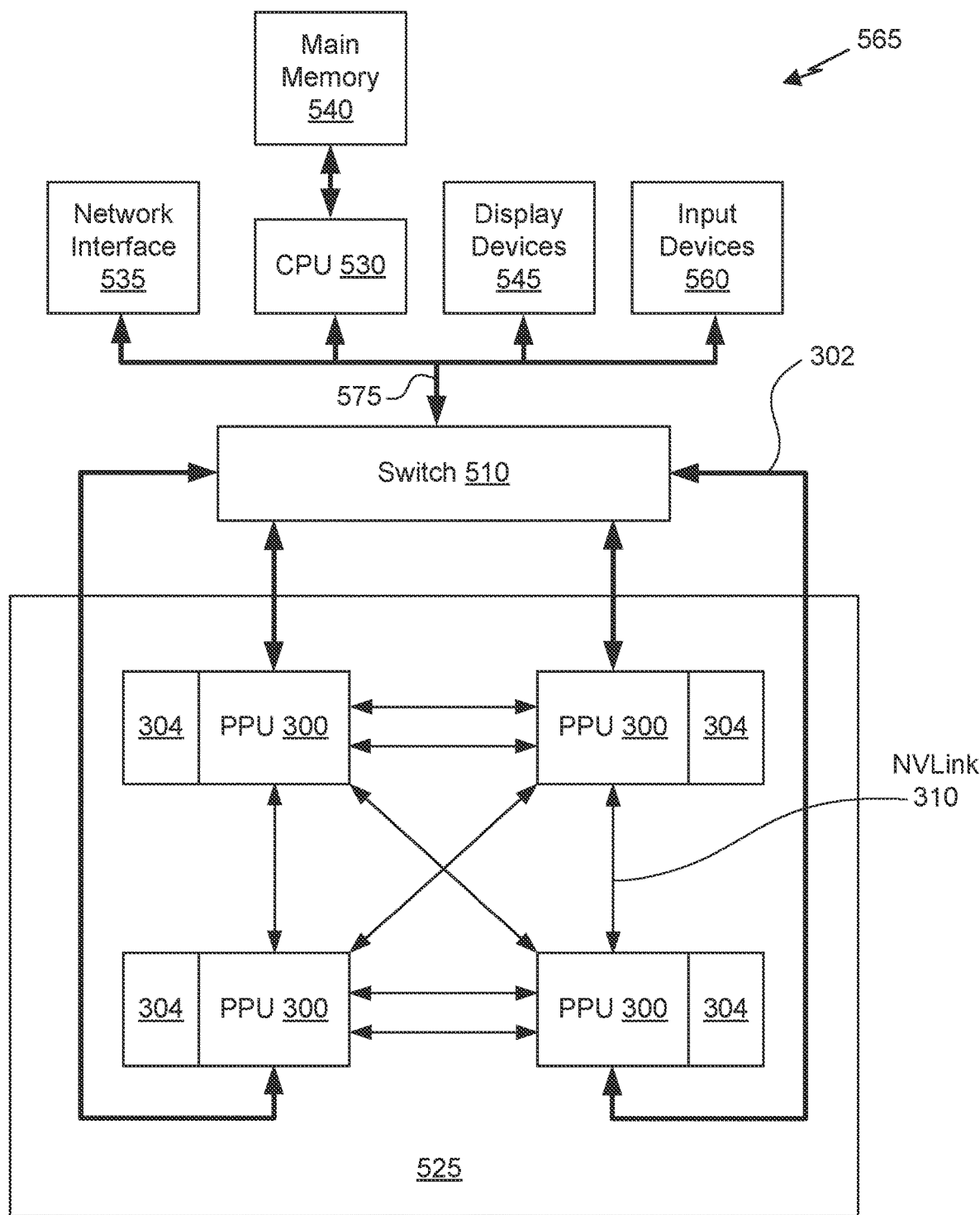
FIG. 5C illustrates an exemplary system in which the various architecture and/or functionality of the various previous embodiments may be implemented.

FIG. 5C illustrates an exemplary system 565 in which the various architecture and/or functionality of the various previous embodiments may be implemented. The exemplary system 565 may be configured to implement the method 100 shown in FIG. 1A.

As shown, a system 565 is provided including at least one central processing unit 530 that is connected to a communication bus 575. The communication bus 575 may be implemented using any suitable protocol, such as PCI (Peripheral Component Interconnect), PCI-Express, AGP (Accelerated Graphics Port), HyperTransport, or any other bus or point-to-point communication protocol(s). The system 565 also includes a main memory 540. Control logic (software) and data are stored in the main memory 540 which may take the form of random access memory (RAM).

The system 565 also includes input devices 560, the parallel processing system 525, and display devices 545, i.e. a conventional CRT (cathode ray tube), LCD (liquid crystal display), LED (light emitting diode), plasma display or the like. User input may be received from the input devices 560, e.g., keyboard, mouse, touchpad, microphone, and the like. Each of the foregoing modules and/or devices may even be situated on a single semiconductor platform to form the system 565. Alternately, the various modules may also be situated separately or in various combinations of semiconductor platforms per the desires of the user.

Further, the system 565 may be coupled to a network (e.g., a telecommunications network, local area network (LAN), wireless network, wide area network (WAN) such as the Internet, peer-to-peer network, cable network, or the like) through a network interface 535 for communication purposes.

The system 565 may also include a secondary storage (not shown). The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 540 and/or the secondary storage. Such computer programs, when executed, enable the system 565 to perform various functions. The memory 540, the storage, and/or any other storage are possible examples of computer-readable media.

The architecture and/or functionality of the various previous figures may be implemented in the context of a general computer system, a circuit board system, a game console system dedicated for entertainment purposes, an application-specific system, and/or any other desired system. For example, the system 565 may take the form of a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, a mobile phone device, a television, workstation, game consoles, embedded system, and/or any other type of logic.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Graphics Processing Pipeline

In an embodiment, the PPU 300 comprises a graphics processing unit (GPU). The PPU 300 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The PPU 300 can be configured to process the graphics primitives to generate a frame buffer (i.e., pixel data for each of the pixels of the display).

An application writes model data for a scene (i.e., a collection of vertices and attributes) to a memory such as a system memory or memory 304. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the SMs 440 of the PPU 300 including one or more of a vertex shader, hull shader, domain shader, geometry shader, and a pixel shader. For example, one or more of the SMs 440 may be configured to execute a vertex shader program that processes a number of vertices defined by the model data. In an embodiment, the different SMs 440 may be configured to execute different shader programs concurrently. For example, a first subset of SMs 440 may be configured to execute a vertex shader program while a second subset of SMs 440 may be configured to execute a pixel shader program. The first subset of SMs 440 processes vertex data to produce processed vertex data and writes the processed vertex data to the L2 cache 460 and/or the memory 304. After the processed vertex data is rasterized (i.e., transformed from three-dimensional data into two-dimensional data in screen space) to produce fragment data, the second subset of SMs 440 executes a pixel shader to produce processed fragment data, which is then blended with other processed fragment data and written to the frame buffer in memory 304. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

Figure 6:
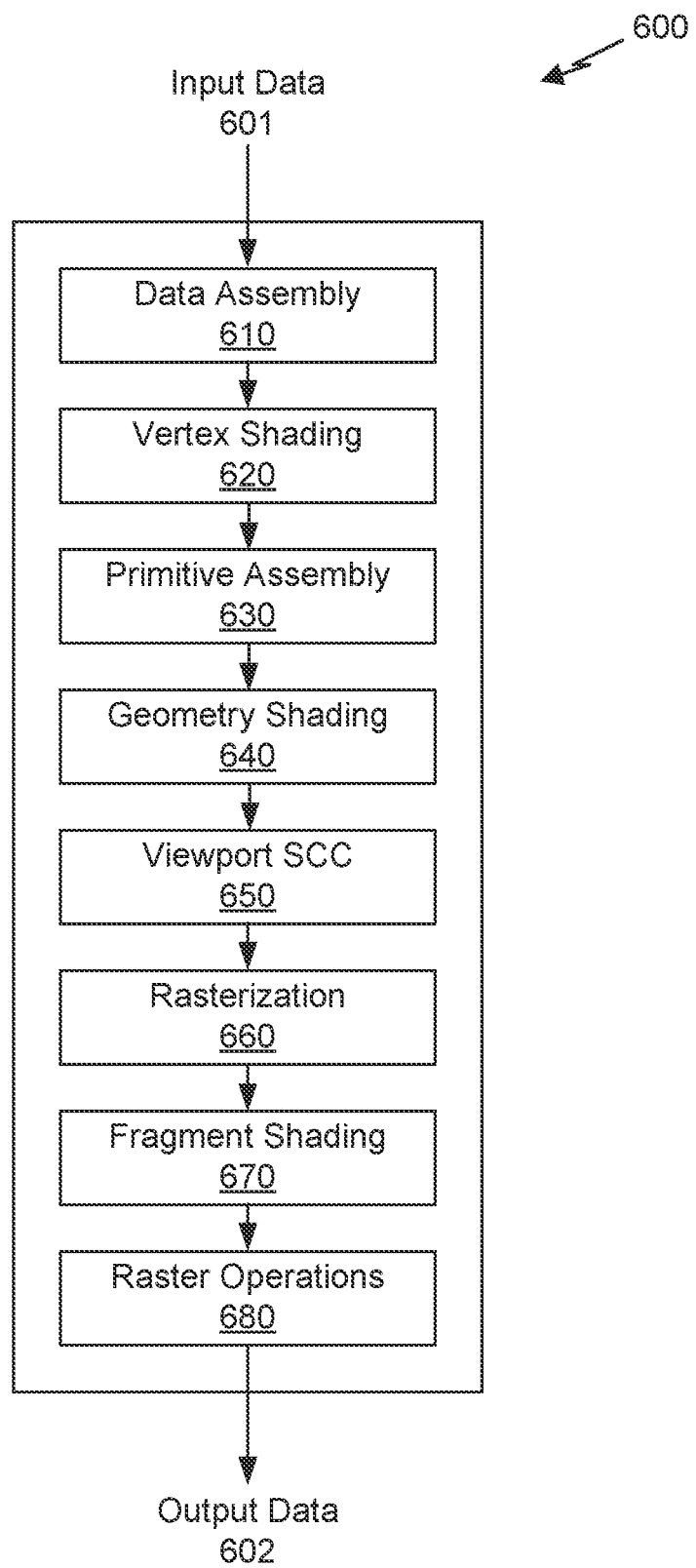
FIG. 6 is a conceptual diagram of a graphics processing pipeline implemented by the PPU of FIG. 3, in accordance with an embodiment.

FIG. 6 is a conceptual diagram of a graphics processing pipeline 600 implemented by the PPU 300 of FIG. 3, in accordance with an embodiment. The graphics processing pipeline 600 is an abstract flow diagram of the processing steps implemented to generate 2D computer-generated images from 3D geometry data. As is well-known, pipeline architectures may perform long latency operations more efficiently by splitting up the operation into a plurality of stages, where the output of each stage is coupled to the input of the next successive stage. Thus, the graphics processing pipeline 600 receives input data 601 that is transmitted from one stage to the next stage of the graphics processing pipeline 600 to generate output data 602. In an embodiment, the graphics processing pipeline 600 may represent a graphics processing pipeline defined by the OpenGL® API. As an option, the graphics processing pipeline 600 may be implemented in the context of the functionality and architecture of the previous Figures and/or any subsequent Figure(s).

As shown in FIG. 6, the graphics processing pipeline 600 comprises a pipeline architecture that includes a number of stages. The stages include, but are not limited to, a data assembly stage 610, a vertex shading stage 620, a primitive assembly stage 630, a geometry shading stage 640, a viewport scale, cull, and clip (VSCC) stage 650, a rasterization stage 660, a fragment shading stage 670, and a raster operations stage 680. In an embodiment, the input data 601 comprises commands that configure the processing units to implement the stages of the graphics processing pipeline 600 and geometric primitives (e.g., points, lines, triangles, quads, triangle strips or fans, etc.) to be processed by the stages. The output data 602 may comprise pixel data (i.e., color data) that is copied into a frame buffer or other type of surface data structure in a memory.

The data assembly stage 610 receives the input data 601 that specifies vertex data for high-order surfaces, primitives, or the like. The data assembly stage 610 collects the vertex data in a temporary storage or queue, such as by receiving a command from the host processor that includes a pointer to a buffer in memory and reading the vertex data from the buffer. The vertex data is then transmitted to the vertex shading stage 620 for processing.

The vertex shading stage 620 processes vertex data by performing a set of operations (i.e., a vertex shader or a program) once for each of the vertices. Vertices may be, e.g., specified as a 4-coordinate vector (i.e., <x, y, z, w>) associated with one or more vertex attributes (e.g., color, texture coordinates, surface normal, etc.). The vertex shading stage 620 may manipulate individual vertex attributes such as position, color, texture coordinates, and the like. In other words, the vertex shading stage 620 performs operations on the vertex coordinates or other vertex attributes associated with a vertex. Such operations commonly including lighting operations (i.e., modifying color attributes for a vertex) and transformation operations (i.e., modifying the coordinate space for a vertex). For example, vertices may be specified using coordinates in an object-coordinate space, which are transformed by multiplying the coordinates by a matrix that translates the coordinates from the object-coordinate space into a world space or a normalized-device-coordinate (NCD) space. The vertex shading stage 620 generates transformed vertex data that is transmitted to the primitive assembly stage 630.

The primitive assembly stage 630 collects vertices output by the vertex shading stage 620 and groups the vertices into geometric primitives for processing by the geometry shading stage 640. For example, the primitive assembly stage 630 may be configured to group every three consecutive vertices as a geometric primitive (i.e., a triangle) for transmission to the geometry shading stage 640. In some embodiments, specific vertices may be reused for consecutive geometric primitives (e.g., two consecutive triangles in a triangle strip may share two vertices). The primitive assembly stage 630 transmits geometric primitives (i.e., a collection of associated vertices) to the geometry shading stage 640.

The geometry shading stage 640 processes geometric primitives by performing a set of operations (i.e., a geometry shader or program) on the geometric primitives. Tessellation operations may generate one or more geometric primitives from each geometric primitive. In other words, the geometry shading stage 640 may subdivide each geometric primitive into a finer mesh of two or more geometric primitives for processing by the rest of the graphics processing pipeline 600. The geometry shading stage 640 transmits geometric primitives to the viewport SCC stage 650.

In an embodiment, the graphics processing pipeline 600 may operate within a streaming multiprocessor and the vertex shading stage 620, the primitive assembly stage 630, the geometry shading stage 640, the fragment shading stage 670, and/or hardware/software associated therewith, may sequentially perform processing operations. Once the sequential processing operations are complete, in an embodiment, the viewport SCC stage 650 may utilize the data. In an embodiment, primitive data processed by one or more of the stages in the graphics processing pipeline 600 may be written to a cache (e.g. L1 cache, a vertex cache, etc.). In this case, in an embodiment, the viewport SCC stage 650 may access the data in the cache. In an embodiment, the viewport SCC stage 650 and the rasterization stage 660 are implemented as fixed function circuitry.

The viewport SCC stage 650 performs viewport scaling, culling, and clipping of the geometric primitives. Each surface being rendered to is associated with an abstract camera position. The camera position represents a location of a viewer looking at the scene and defines a viewing frustum that encloses the objects of the scene. The viewing frustum may include a viewing plane, a rear plane, and four clipping planes. Any geometric primitive entirely outside of the viewing frustum may be culled (i.e., discarded) because the geometric primitive will not contribute to the final rendered scene. Any geometric primitive that is partially inside the viewing frustum and partially outside the viewing frustum may be clipped (i.e., transformed into a new geometric primitive that is enclosed within the viewing frustum. Furthermore, geometric primitives may each be scaled based on a depth of the viewing frustum. All potentially visible geometric primitives are then transmitted to the rasterization stage 660.

The rasterization stage 660 converts the 3D geometric primitives into 2D fragments (e.g. capable of being utilized for display, etc.). The rasterization stage 660 may be configured to utilize the vertices of the geometric primitives to setup a set of plane equations from which various attributes can be interpolated. The rasterization stage 660 may also compute a coverage mask for a plurality of pixels that indicates whether one or more sample locations for the pixel intercept the geometric primitive. In an embodiment, z-testing may also be performed to determine if the geometric primitive is occluded by other geometric primitives that have already been rasterized. The rasterization stage 660 generates fragment data (i.e., interpolated vertex attributes associated with a particular sample location for each covered pixel) that are transmitted to the fragment shading stage 670.

The fragment shading stage 670 processes fragment data by performing a set of operations (i.e., a fragment shader or a program) on each of the fragments. The fragment shading stage 670 may generate pixel data (i.e., color values) for the fragment such as by performing lighting operations or sampling texture maps using interpolated texture coordinates for the fragment. The fragment shading stage 670 generates pixel data that is transmitted to the raster operations stage 680.

The raster operations stage 680 may perform various operations on the pixel data such as performing alpha tests, stencil tests, and blending the pixel data with other pixel data corresponding to other fragments associated with the pixel. When the raster operations stage 680 has finished processing the pixel data (i.e., the output data 602), the pixel data may be written to a render target such as a frame buffer, a color buffer, or the like.

It will be appreciated that one or more additional stages may be included in the graphics processing pipeline 600 in addition to or in lieu of one or more of the stages described above. Various implementations of the abstract graphics processing pipeline may implement different stages. Furthermore, one or more of the stages described above may be excluded from the graphics processing pipeline in some embodiments (such as the geometry shading stage 640). Other types of graphics processing pipelines are contemplated as being within the scope of the present disclosure. Furthermore, any of the stages of the graphics processing pipeline 600 may be implemented by one or more dedicated hardware units within a graphics processor such as PPU 300. Other stages of the graphics processing pipeline 600 may be implemented by programmable hardware units such as the SM 440 of the PPU 300.

The graphics processing pipeline 600 may be implemented via an application executed by a host processor, such as a CPU. In an embodiment, a device driver may implement an application programming interface (API) that defines various functions that can be utilized by an application in order to generate graphical data for display. The device driver is a software program that includes a plurality of instructions that control the operation of the PPU 300. The API provides an abstraction for a programmer that lets a programmer utilize specialized graphics hardware, such as the PPU 300, to generate the graphical data without requiring the programmer to utilize the specific instruction set for the PPU 300. The application may include an API call that is routed to the device driver for the PPU 300. The device driver interprets the API call and performs various operations to respond to the API call. In some instances, the device driver may perform operations by executing instructions on the CPU. In other instances, the device driver may perform operations, at least in part, by launching operations on the PPU 300 utilizing an input/output interface between the CPU and the PPU 300. In an embodiment, the device driver is configured to implement the graphics processing pipeline 600 utilizing the hardware of the PPU 300.

Various programs may be executed within the PPU 300 in order to implement the various stages of the graphics processing pipeline 600. For example, the device driver may launch a kernel on the PPU 300 to perform the vertex shading stage 620 on one SM 440 (or multiple SMs 440). The device driver (or the initial kernel executed by the PPU 400) may also launch other kernels on the PPU 400 to perform other stages of the graphics processing pipeline 600, such as the geometry shading stage 640 and the fragment shading stage 670. In addition, some of the stages of the graphics processing pipeline 600 may be implemented on fixed unit hardware such as a rasterizer or a data assembler implemented within the PPU 400. It will be appreciated that results from one kernel may be processed by one or more intervening fixed function hardware units before being processed by a subsequent kernel on an SM 440.

Machine Learning

Deep neural networks (DNNs) developed on processors, such as the PPU 300 have been used for diverse use cases, from self-driving cars to faster drug development, from automatic image captioning in online image databases to smart real-time language translation in video chat applications. Deep learning is a technique that models the neural learning process of the human brain, continually learning, continually getting smarter, and delivering more accurate results more quickly over time. A child is initially taught by an adult to correctly identify and classify various shapes, eventually being able to identify shapes without any coaching. Similarly, a deep learning or neural learning system needs to be trained in object recognition and classification for it get smarter and more efficient at identifying basic objects, occluded objects, etc., while also assigning context to objects.

At the simplest level, neurons in the human brain look at various inputs that are received, importance levels are assigned to each of these inputs, and output is passed on to other neurons to act upon. An artificial neuron or perceptron is the most basic model of a neural network. In one example, a perceptron may receive one or more inputs that represent various features of an object that the perceptron is being trained to recognize and classify, and each of these features is assigned a certain weight based on the importance of that feature in defining the shape of an object.

A deep neural network (DNN) model includes multiple layers of many connected perceptrons (e.g., nodes) that can be trained with enormous amounts of input data to quickly solve complex problems with high accuracy. In one example, a first layer of the DLL model breaks down an input image of an automobile into various sections and looks for basic patterns such as lines and angles. The second layer assembles the lines to look for higher level patterns such as wheels, windshields, and mirrors. The next layer identifies the type of vehicle, and the final few layers generate a label for the input image, identifying the model of a specific automobile brand.

Once the DNN is trained, the DNN can be deployed and used to identify and classify objects or patterns in a process known as inference. Examples of inference (the process through which a DNN extracts useful information from a given input) include identifying handwritten numbers on checks deposited into ATM machines, identifying images of friends in photos, delivering movie recommendations to over fifty million users, identifying and classifying different types of automobiles, pedestrians, and road hazards in driverless cars, or translating human speech in real-time.

During training, data flows through the DNN in a forward propagation phase until a prediction is produced that indicates a label corresponding to the input. If the neural network does not correctly label the input, then errors between the correct label and the predicted label are analyzed, and the weights are adjusted for each feature during a backward propagation phase until the DNN correctly labels the input and other inputs in a training dataset. Training complex neural networks requires massive amounts of parallel computing performance, including floating-point multiplications and additions that are supported by the PPU 300. Inferencing is less compute-intensive than training, being a latency-sensitive process where a trained neural network is applied to new inputs it has not seen before to classify images, translate speech, and generally infer new information.

Neural networks rely heavily on matrix math operations, and complex multi-layered networks require tremendous amounts of floating-point performance and bandwidth for both efficiency and speed. With thousands of processing cores, optimized for matrix math operations, and delivering tens to hundreds of TFLOPS of performance, the PPU 300 is a computing platform capable of delivering performance required for deep neural network-based artificial intelligence and machine learning applications.

What is claimed is:

1. A method, comprising:
   accessing a code stored in a first portion of a memory, wherein the code is generated by encoding data using an encoder included in error correcting code (ECC) logic, the data stored in a second portion of the memory, and wherein the ECC logic further includes a decoder;
   detecting an error in the code caused by a hardware fault in the encoder or the decoder included in the ECC logic;
   determining that the error in the code is correctable;
   correcting the error in the code to form a corrected code;
   retrieving the data from the second portion of the memory;
   verifying the retrieved data using the corrected code;
   accessing a second code stored in the first portion of a memory, wherein the second code is created for second data using the encoder included in the ECC logic;
   detecting an error in the second code caused by a hardware fault in the encoder or the decoder included in the ECC logic; and
   responsive to determining that the error in the second code is not correctable, indicating that the error in the second code is not correctable.

2. The method of claim 1, wherein the error in the code is caused by the hardware fault in the decoder.

3. The method of claim 1, wherein the ECC logic is included in a vehicle.

4. The method of claim 1, wherein the ECC logic is included in a robot.

5. The method of claim 1, wherein the code is one of: single-error detecting (SED), single-error correcting (SEC), or single-error correcting-double error detecting (SEC-DED).

6. The method of claim 1, wherein the hardware fault is a single stuck-at fault.

7. The method of claim 1, wherein the ECC logic is single-error correcting (SEC) and the encoder of the ECC logic is constrained to avoid any sharing of common sub-expressions for checkbit outputs forming the code.

8. The method of claim 7, wherein when the error in the code is caused by the hardware fault in the encoder, a corruption by the hardware fault will affect at most a single one of the checkbit outputs which is correctable by the decoder of the ECC logic.

9. The method of claim 1, wherein the ECC logic is single-error correcting-double error detecting (SEC-DED) and the encoder of the ECC logic is constrained to avoid sharing of more than two common sub-expressions for checkbit outputs forming the code.

10. The method of claim 9, wherein when the error in the code is caused by the hardware fault in the encoder, a corruption by the hardware fault will affect at most two of the checkbit outputs which are correctable by the decoder of the ECC logic.

11. The method of claim 1, wherein the ECC logic is single-error correcting (SEC) and the decoder of the ECC logic is constrained to avoid any sharing of common sub-expressions for bit outputs of the decoder.

12. The method of claim 11, wherein when the error in the code is caused by the hardware fault in the decoder, a corruption by the hardware fault will at most affect a single one of the bit outputs which is correctable by the decoder of the ECC logic.

13. The method of claim 1, wherein the ECC logic is single-error correcting-double error detecting (SEC-DED) and the decoder of the ECC logic is constrained to avoid sharing of more than two common sub-expressions for bit outputs of the decoder.

14. The method of claim 13, wherein when the error in the code is caused by the hardware fault in the decoder, a corruption by the hardware fault will affect at most two of the bit outputs which are correctable by the decoder of the ECC logic.

15. The method of claim 1, wherein an algorithm utilized by the ECC logic is configured to select lowest odd-weight columns for minimizing sharing of common sub-expressions in the ECC logic.

16. A system, comprising:
    error correcting code (ECC) circuitry configured to:
    access a code stored in a first portion of a memory, wherein the code is generated by encoding data using an encoder included in the ECC circuitry, the data stored in a second portion of the memory, wherein the ECC circuitry further includes a decoder;
    detect an error in the code caused by a hardware fault in the encoder or the decoder included in the ECC circuitry;
    determine that the error in the code is correctable;
    correct the error in the code to form a corrected code;
    retrieve the data from the second portion of the memory;
    verify the retrieved data using the corrected code;
    access a second code stored in the first portion of the memory, wherein the second code is created for second data using the encoder included in the ECC circuitry;
    detect an error in the second code caused by a hardware fault in the encoder or the decoder included in the ECC circuitry; and
    responsive to determining that the error in the second code is not correctable, indicate that the error in the second code is not correctable.

17. The system of claim 16, wherein the ECC circuitry is single error correcting (SEC) and the encoder of the ECC circuitry is constrained to avoid any sharing of common sub-expressions for checkbit outputs forming the code, or the ECC circuitry is single error correcting-double error detecting (SEC-DED) and the encoder of the ECC circuitry is constrained to avoid sharing of more than two common sub-expressions for the checkbit outputs forming the code.

18. The system of claim 16, wherein the ECC circuitry is single error correcting (SEC) and the decoder of the ECC circuitry is constrained to avoid any sharing of common sub-expressions for bit outputs of the decoder, or the ECC circuitry is single error correcting-double error detecting (SEC-DED) and the decoder of the ECC circuitry is constrained to avoid sharing of more than two common sub-expressions for bit outputs of the decoder.

19. The system of claim 16, wherein the ECC circuitry is included in a vehicle.

20. The system of claim 16, wherein the ECC circuitry is included in a robot.

21. The system of claim 16, wherein the verified data is utilized by a neural network.

* * * * *